(12) United States Patent
Dozaka

(10) Patent No.: US 8,953,357 B2
(45) Date of Patent: Feb. 10, 2015

(54) SEMICONDUCTOR MEMORY DEVICE

(75) Inventor: Toshiaki Dozaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 386 days.

(21) Appl. No.: 13/413,183

(22) Filed: Mar. 6, 2012

(65) Prior Publication Data
US 2013/0070533 A1    Mar. 21, 2013

(30) Foreign Application Priority Data

Sep. 21, 2011 (JP) ................. 2011-206547

(51) Int. Cl.
G11C 17/00 (2006.01)
G11C 7/10 (2006.01)
G11C 7/12 (2006.01)
H01L 27/02 (2006.01)
H01L 27/112 (2006.01)

(52) U.S. Cl.
CPC ............ G11C 7/1006 (2013.01); G11C 7/1012 (2013.01); G11C 7/12 (2013.01); H01L 27/0207 (2013.01); H01L 27/11226 (2013.01)
USPC ............................. 365/94; 365/174; 365/104

(58) Field of Classification Search
USPC .......................................... 365/94, 174, 104
See application file for complete search history.

(56) References Cited

U.S. PATENT DOCUMENTS

| 6,002,607 | A | * | 12/1999 | Dvir | .............................. 365/103 |
| 6,304,480 | B1 | | 10/2001 | Schoellkopf | |
| 7,649,762 | B1 | | 1/2010 | Lin et al. | |
| 2005/0226068 | A1 | * | 10/2005 | Brandon et al. | ............... 365/203 |

FOREIGN PATENT DOCUMENTS

| JP | 5-29161 | 4/1993 |
| JP | 2012-238626 A | 12/2012 |

OTHER PUBLICATIONS

Office Action issued on Jan. 21, 2014 in the corresponding Japanese Patent Application No. 2011-206547 (with English Translation).
Office Action issued Apr. 8, 2014 in Japanese Patent Application No. 2011-206547 with English language translation.

* cited by examiner

Primary Examiner — Han Yang
(74) Attorney, Agent, or Firm — Oblon, Spivak, McClelland, Maier & Neustadt, L.L.P.

(57) ABSTRACT

A semiconductor memory device according to an embodiment includes a memory cell array including memory cells each formed from a transistor formed over an active area of a well and disposed at intersections of a word line and a bit line group, the memory cell having different connection states including a state in which a source or a drain of the transistor is not electrically connected to any one of bit lines belonging to the bit line group and states in which the source or the drain is electrically connected only to a specific one of the bit lines, and an active area serving as a gate of the transistor being continuously formed in arrangement areas of the bit lines of the bit line group and spaces between the bit lines.

20 Claims, 25 Drawing Sheets

FIG. 1
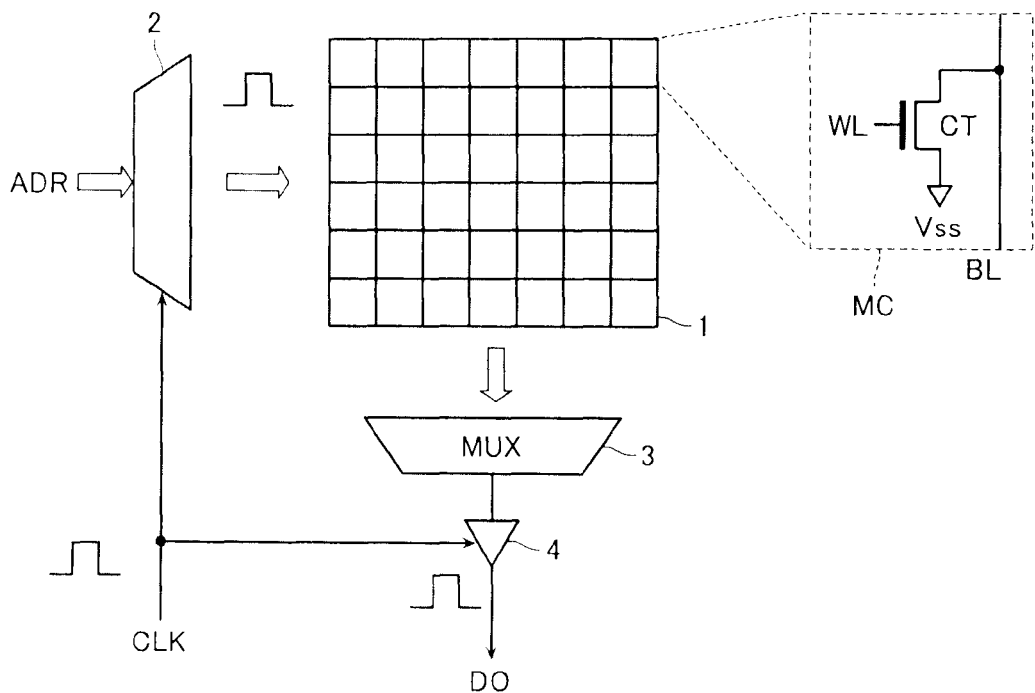
FIG. 2A
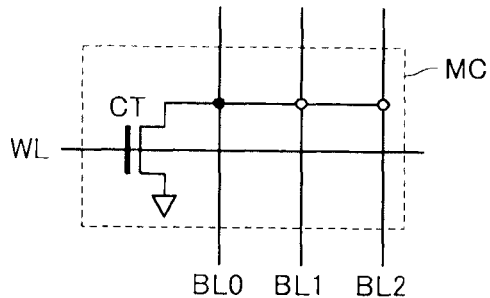
FIG. 2B
| BL0 | BL1 | BL2 |
|-----|-----|-----|
| 1   | 1   | 1   |
| 0   | 1   | 1   |
| 1   | 0   | 1   |
| 1   | 1   | 0   |

| BL0 | BL1 | BL2 | DO[0] | DO[1] |
|-----|-----|-----|-------|-------|
| 1 | 1 | 1 | 0 | 0 |
| 0 | 1 | 1 | 1 | 0 |
| 1 | 0 | 1 | 0 | 1 |
| 1 | 1 | 0 | 1 | 1 |

| BL0[0] | BL0[1] | BL0[2] | BL0[3] | DO[0] | DO[1] | DO[2] |
|---|---|---|---|---|---|---|
| 1 | 1 | 1 | 1 | 0 | 0 | 0 |
| 0 | 1 | 1 | 1 | 0 | 0 | 1 |
| 1 | 0 | 1 | 1 | 0 | 1 | 0 |
| 1 | 1 | 0 | 1 | 0 | 1 | 1 |
| 0 | 1 | 0 | 1 | 1 | 0 | 0 |
| 1 | 0 | 0 | 1 | 1 | 0 | 1 |
| 1 | 1 | 1 | 0 | 1 | 1 | 0 |
| 0 | 1 | 1 | 0 | 1 | 1 | 1 |
| 1 | 0 | 1 | 0 | - | - | - |

FIG. 27A
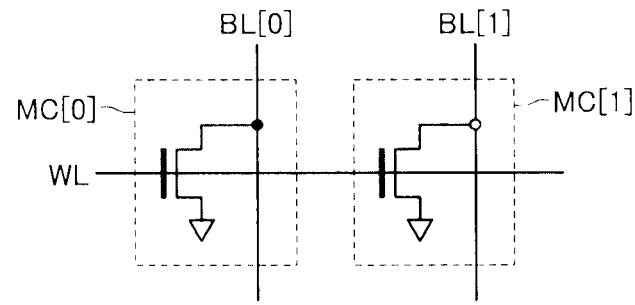
FIG. 27B
| BL[0] | BL[1] |
|-------|-------|
| 0 | 0 |
| 0 | 1 |
| 1 | 0 |
| 1 | 1 |
FIG. 28
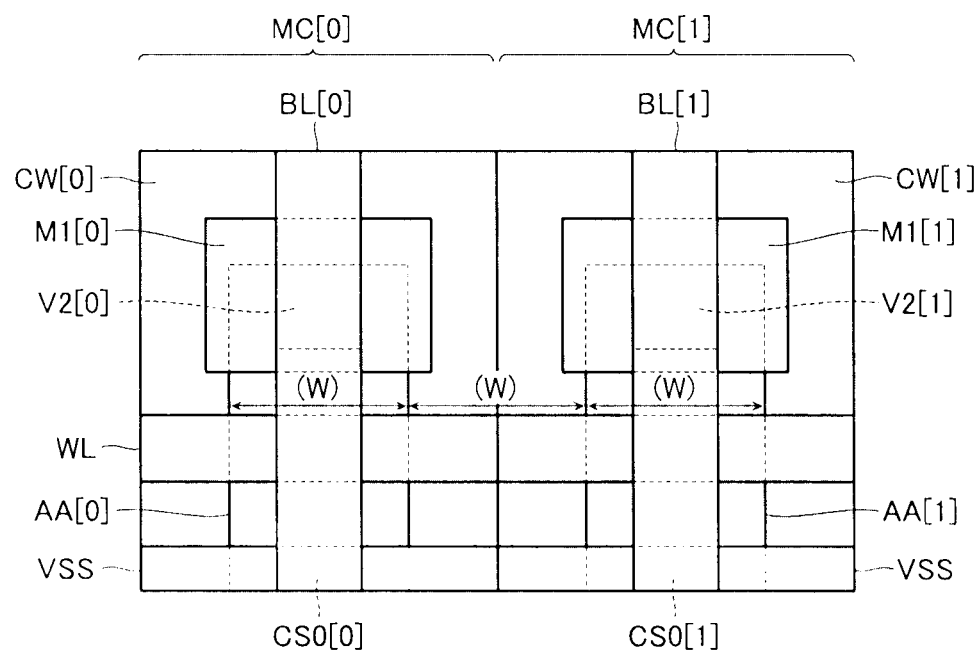

| BL0 | BL1 | DO[0] | DO[1] |
|---|---|---|---|
| 0 | 0 | 0 | 0 |
| 0 | 1 | 0 | 1 |
| 1 | 0 | 1 | 0 |
| 1 | 1 | 1 | 1 |

| BL[0] | BL[1] | BL[2] | DO[0] | DO[1] | DO[2] |
|---|---|---|---|---|---|
| 0 | 0 | 0 | 0 | 0 | 0 |
| 1 | 0 | 0 | 1 | 0 | 0 |
| 0 | 1 | 0 | 0 | 1 | 0 |
| 1 | 1 | 0 | 1 | 1 | 0 |
| 0 | 0 | 1 | 0 | 0 | 1 |
| 1 | 0 | 1 | 1 | 0 | 1 |
| 0 | 1 | 1 | 0 | 1 | 1 |
| 1 | 1 | 1 | 1 | 1 | 1 |

SEMICONDUCTOR MEMORY DEVICE

CROSS-REFERENCE TO RELATED APPLICATIONS

This application is based upon and claims the benefit of priority from the prior Japanese Patent Application No. 2011-206547, filed on Sep. 21, 2011, the entire contents of which are incorporated herein by reference.

FIELD

Embodiments described herein relate to a semiconductor memory device.

BACKGROUND

As the miniaturization of semiconductor memory devices advances, the manufacturing variations of transistors are not ignorable. In the case of a mask ROM, an operating speed depends on a gate width of a cell transistor. Accordingly, in a case where a cell transistor having a small gate width is used, while the circuit area can be suppressed, the variation in the value of a current flowing in the cell transistor is large, and it is necessary to decrease the operating speed of the mask ROM. On the other hand, in a case where a cell transistor having a large gate width is used, while data can be read out at high speed due to a large value of the current flowing in the cell transistor, the circuit area is increased.

In other words, in order to increase the current of the cell transistor and decrease the manufacturing variation, while it is necessary to increase the gate width of the cell transistor, there is a problem of increasing the circuit area of the cell transistor in such a case.

BRIEF DESCRIPTION OF THE DRAWINGS

FIG. 1 is a block diagram of a semiconductor memory device according to a first embodiment;

FIG. 2A is a circuit diagram of a memory cell of the semiconductor memory device according to the above-described embodiment;

FIG. 2B is a diagram illustrating a state of the memory cell of the semiconductor memory device according to the above-described embodiment;

FIG. 27A is a circuit diagram of a memory cell of a semiconductor memory device according to a comparative example of the first embodiment;

FIG. 27B is a diagram illustrating a state of the memory cell of the semiconductor memory device according to the above-described comparative example;

FIG. 28 is a diagram illustrating a layout of the memory cell of the semiconductor memory device according to the above-described comparative example;

DETAILED DESCRIPTION

Figure 3A:
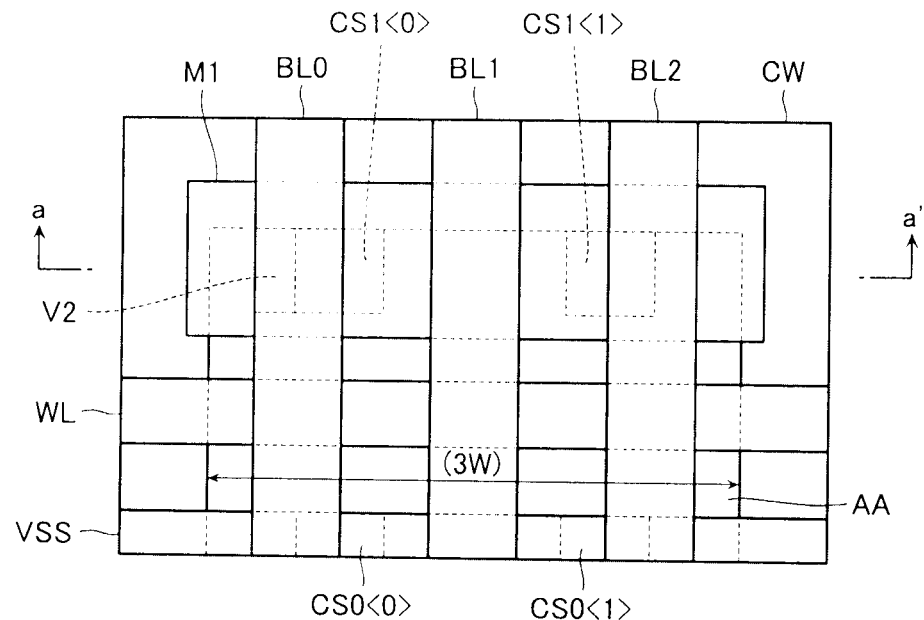
FIG. 3A is a diagram illustrating a layout of the memory cell of the semiconductor memory device according to the above-described embodiment.

A semiconductor memory device according to an embodiment includes a memory cell array that includes a word line extending in a row direction, a bit line group containing a plurality of bit lines extending in a column direction, and memory cells each formed from a transistor formed over an active area of a well and disposed at intersections of the word line and the bit line group and a read circuit configured to read data from the memory cell through the bit line. The memory cell has different connection states including a state in which the source or the drain of the transistor is not electrically connected to any one of the plurality of bit lines corresponding to the bit line group and states in which the source or the drain of the transistor is connected to only specific one of the bit lines, and, when viewed in a stacking direction that is perpendicular to the row direction and the column direction, an active area that serves as the gate of the transistor is configured to be continuously formed in areas in which the plurality of bit lines of the bit line group is arranged and spaces between the bit lines.

Hereinafter, semiconductor memory devices according to embodiments will be described with reference to the drawings.

First Embodiment

Whole Configuration

FIG. 1 is a diagram illustrating the whole configuration of a semiconductor memory device according to a first embodiment.

The semiconductor memory device includes a memory cell array 1. The memory cell array 1 includes: a plurality of word lines WL that extend in parallel with the row direction; a plurality of bit lines BLs that extend in parallel with the column direction; and memory cells MCs that are disposed at the intersections of the word lines WL and the bit lines BL.

The memory cell MC includes a transistor CT (hereinafter, referred to as a "cell transistor") that has the source (or the drain) connected to a ground wire VSS and the gate connected to the word line WL and stores data based on whether the drain (or the source) of the cell transistor CT and the bit line BL are connected to each other. In this embodiment and in the description presented below, a state in which the drain of the cell transistor CT and the bit line BL are connected to each other is represented as "0" and, as illustrated in FIG. 1, is denoted by a black dot. On the other hand, a state in which the drain of the cell transistor CT and the bit line BL are not connected to each other is represented as "1" and, differently from that illustrated in FIG. 1, is denoted by a white dot.

In addition, the semiconductor memory device includes: a word line driver 2 that drives the word line WL based on an input address ADR; a column multiplexer 3 that selectively outputs voltages appearing in the plurality of bit lines BLs; and a read circuit 4 that outputs a voltage appearing in the bit line BL, which is output through the column multiplexer 3, as output data DO. The word line driver 2 and the read circuit 4 are operated based on an input clock CLK.

<Configuration of Memory Cell>

Here, the structure of the memory cell MC will be described. Hereinafter, it is assumed that one memory cell MC is configured by one cell transistor CT. In addition, a set of bit lines BLs that intersects the drain (or the source) of the cell transistor CT may be referred to as a "bit line group". Furthermore, the structure of the memory cell MC in a case where the bit line group is configured by n bit lines BLs may be referred to as an "n bit line-type memory cell".

In the first embodiment, while the configuration of a memory cell will be described in which two bit data is stored, as a premise of the description for the memory cell MC of this embodiment, the structure of a memory cell MC of a comparative example will be described.

FIG. 27A is a circuit diagram of the memory cell MC of the comparative example of the first embodiment, and FIG. 27B is a diagram illustrating combinations of connection states of the cell transistor CT and the bit line BL of the memory cell MC according to the comparative example.

In the case of the comparative example, the memory cell MC, as illustrated in FIG. 27A, has a one bit line-type structure. In the case of the one bit line-type, there are two states including a state in which the cell transistor CT and the bit line BL are connected to each other and a state in which the cell transistor CT and the bit line BL are not connected to each other.

Thus, as illustrated in FIG. 27A, four connection states, as illustrated in FIG. 27B, are produced based on a combination of the connection states of the cell transistors CTs of the memory cells MC[0] and MC[1] and the bit lines BLs by using two one bit line-type memory cells MCs [0] and [1], and two bit data is stored therein.

FIG. 28 is a diagram illustrating the layout of the memory cells MCs illustrated in FIG. 27A.

In the case of the comparative example illustrated in FIG. 28, the memory cells MC[0] and MC[1], as illustrated below, are formed on two cell wells CW[0] and CW [1] that are aligned in the row direction.

In other words, in each cell well CW[j] (j=0 or 1), an active area AA[j] is formed. Here, both the width of the active area AA[j] in the row direction and the width of a space between the active areas AA[0] and AA[1] in the row direction are configured to be W (generally, the width W is in the order of μm).

Over the cell wells CW[0] and CW[1], the ground wire VSS is formed which extends in the row direction over the active areas AA[0] and AA[1]. This ground wire VSS is electrically connected to the active area AA[j] through a via CS0[j] that extends in the stacking direction perpendicular to the row direction and the column direction.

Over the active area AA[j], a metal wiring M1[j] is formed. The metal wiring M1[j] is electrically connected to the active area AA[j] through a via CS1[j], which is not illustrated in the figure, located on the lower layer. In addition, over the metal wiring M1[j], a bit line BL[j] extending in the column direction is formed.

In addition, on the active areas AA[0] and AA[1], a word line WL is formed so as to extend over the active areas AA[0] and AA[1] in the row direction in an area between the ground wiring VSS and the metal wirings M1[0] and M1[1] in the column direction, when viewed in the stacking direction.

Furthermore, as the memory cell MC[0] illustrated in FIG. 27A, in a case where the cell transistor CT and the bit line BL are connected to each other, as illustrated in FIG. 28, the metal wiring M1 and the bit line BL may be electrically connected to each other through a via V2 located in the upper layer.

In the case of the above-described layout, the gate width of the cell transistor CT of the memory cell MC[j] is the width W of each active area AA[j] in the row direction.

Next, the configuration of the memory cell MC according to this embodiment will be described.

FIG. 2A is a circuit diagram of the memory cell MC according to the first embodiment, and FIG. 2B is a diagram illustrating combinations of the connection states of the cell transistor CT and the bit line BL of the memory cell MC according to this embodiment.

The memory cell MC according to this embodiment, as illustrated in FIG. 2A, has a three bit line-type structure in which the drain (or the source) of one cell transistor CT intersects a bit line group that is configured by three bit lines BL0 to BL2.

The memory cell MC, as illustrated in FIG. 2B, can store two bit data based on four different connection states including a state in which the cell transistor CT is not connected to any one of bit lines BL0 to BL2 belonging to the bit line group and states in which the cell transistor CT is connected to only specific one of the bit lines. FIG. 2A illustrates a case where the cell transistor CT of the memory cell MC and only the bit line BL0 are connected to each other.

Figure 3B:
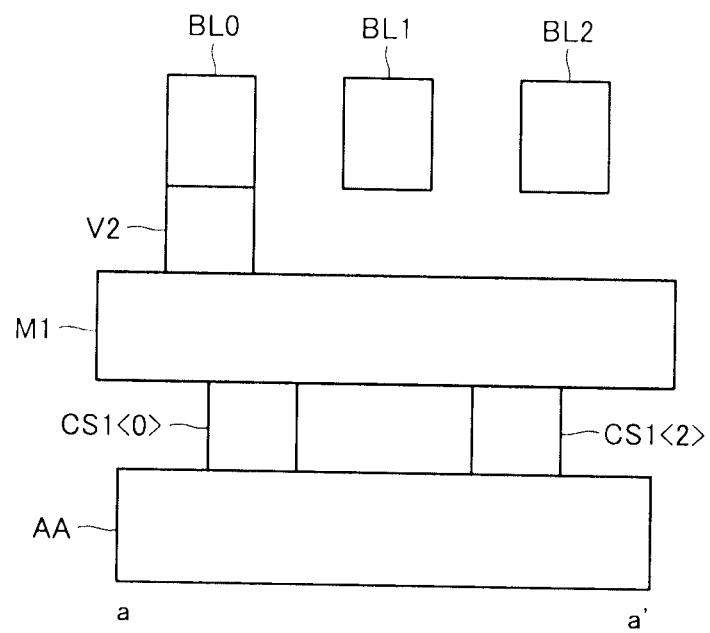
FIG. 3B is a diagram illustrating a cross-section of the layout of the memory cell of the semiconductor memory device according to the above-described embodiment.

FIGS. 3A and 3B are diagrams illustrating a layout of the memory cell MC illustrated in FIG. 2A. FIG. 3A is a plan view when viewed in the stacking direction, and FIG. 3B is a cross-sectional view taken along line a-a' illustrated in FIG. 3A. Here, FIG. 3A is a layout that is on the premise of forming the memory cell on the cell well CW having the same area as the area acquired by combining the cell wells CW[0] and CW[1] illustrated in the comparative example illustrated in FIG. 28.

In the case of this embodiment illustrated in FIGS. 3A and 3B, the memory cell MC, as illustrated below, is formed on the cell well CW that is located in a well.

In other words, an active area AA is formed in the cell well CW. Here, the active area AA is formed to have a size acquired by combining the active areas AA[0] and AA[1] and a space between the active areas AA[0] and AA[1] of the comparative example illustrated in FIG. 28. In other words, the width of the active area AA in the row direction is 3×W.

Over the cell well CW, the ground wire VSS is formed which extends over the active area AA in the row direction. This ground wire VSS is electrically connected to the active area AA through two vias CS0<0> and CS0<1> extending in the stacking direction.

Over the active area AA, a metal wiring M1 is formed which has a width of a same level as that of the width of the active area AA in the row direction. The metal wiring M1 is electrically connected to the active area AA through two vias CS1<0> and CS1<1> that extend in the stacking direction. Over the metal wiring M1, the three bit lines BL0 to BL2, which extend in the column direction, are formed.

In addition, over the active area AA, the word line WL that extends over the active area AA in the row direction is formed in an area formed between the ground wire VSS and the metal wiring M1 in the column direction, when viewed in the stacking direction.

Furthermore, as illustrated in FIG. 2A, in a case where the connection state of the memory cell MC is set as (BL0, BL1, BL2)=(0, 1, 1), as illustrated in FIGS. 3A and 3B, the bit line BL0 and the metal wiring M1 may be electrically connected to each other through a via V2 that is located in the upper layer.

In the case of the above-described layout, the gate width of the cell transistor CT of the memory cell MC is the width 3×W of the active area AA in the row direction.

In other words, in the case of this embodiment, as in the comparative example, by arranging two one bit line-type memory cells to one three bit line-type memory cell, the gate width of the cell transistor in the row direction can be configured to be longer than that of the comparative example while maintaining the same circuit area and the same storage capacity as those of the comparative example. In the case of the layout illustrated in FIGS. 3A and 3B, since the gate width of the cell transistor is increased by three times, it can be achieved that the reading speed is improved by three times.

Next, a case will be described in which the memory cell array 1 is configured by arranging the above-described memory cells MCs.

Figure 29:
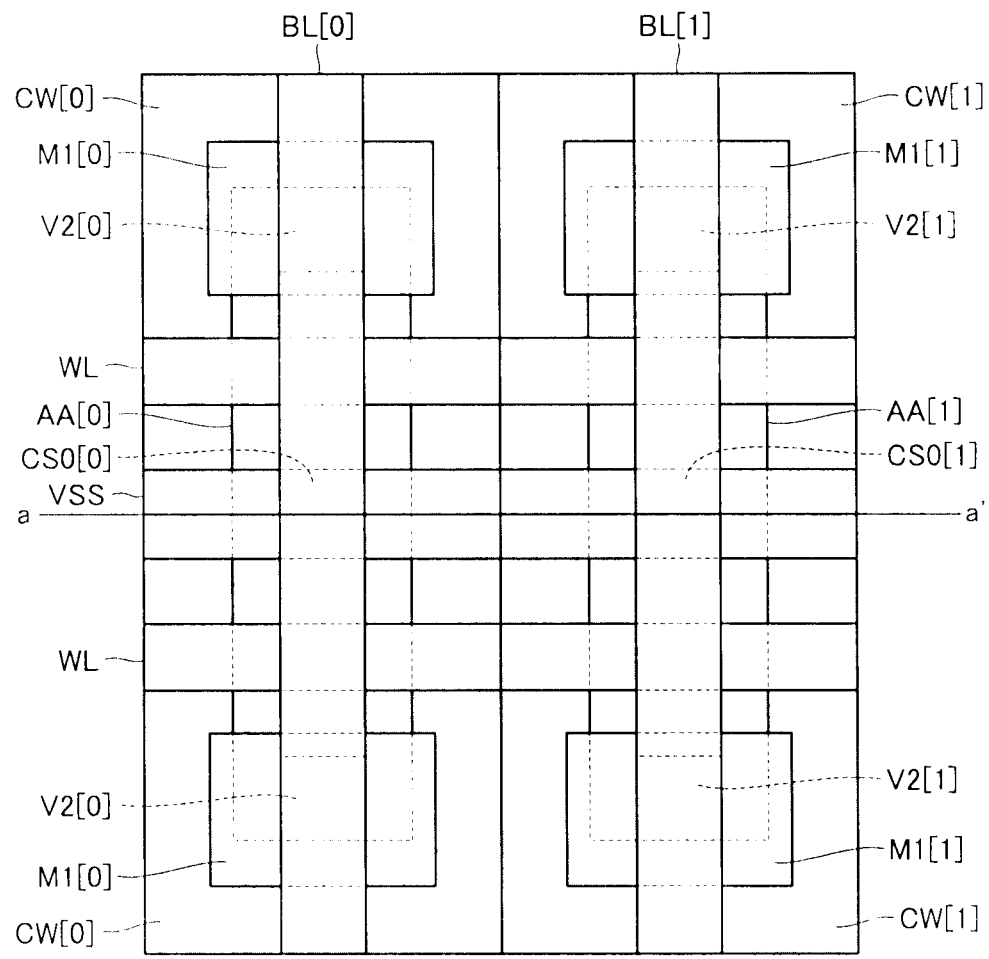
FIG. 29 is a diagram illustrating a layout of the memory cell of the semiconductor memory device according to the above-described comparative example.

FIG. 29 illustrates the case of the comparative example and is a layout in a case where two one bit line-type memory cells MCs are aligned in the column direction. In the case of the comparative example, a configuration is formed in which the layout illustrated in FIG. 28 and a layout that is line symmetrical to the above-described layout with respect to axis a-a' illustrated in FIG. 29 as the symmetrical axis are continuously arranged in the column direction.

Figure 4:
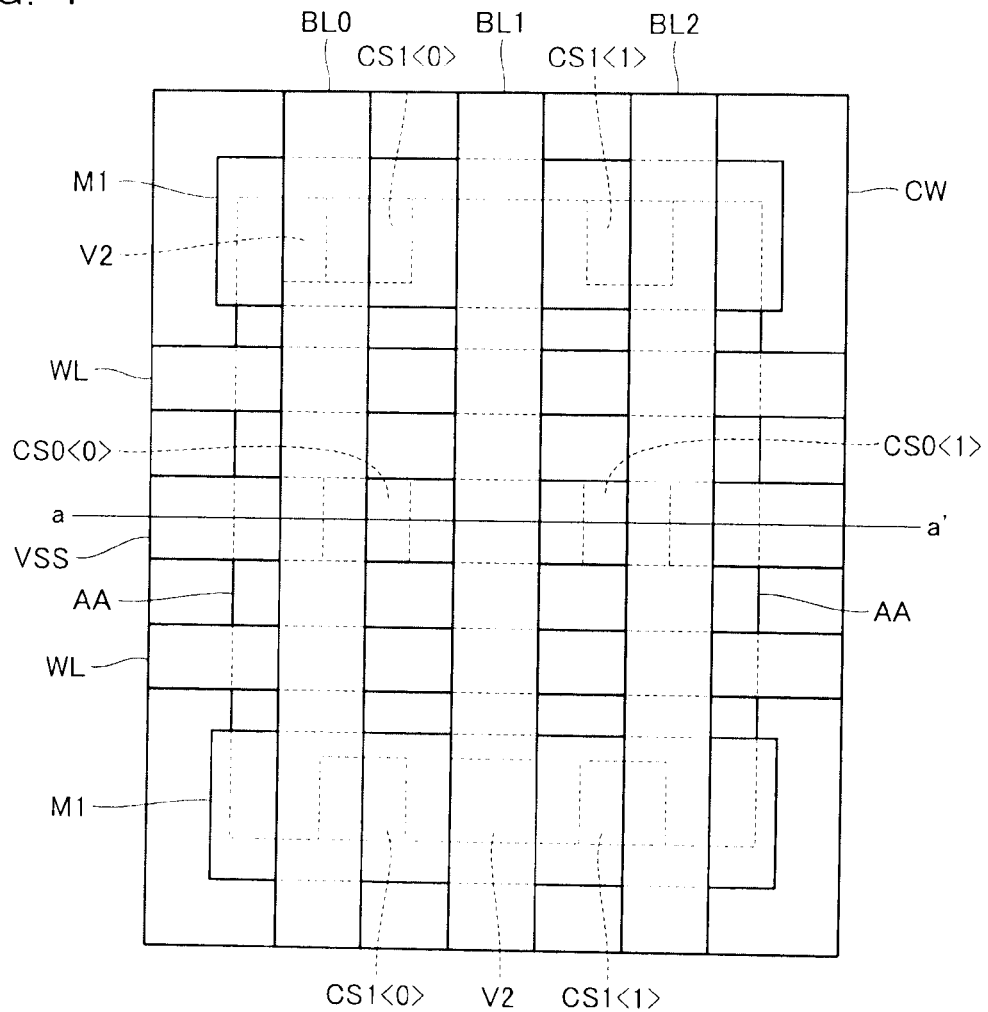
FIG. 4 is a diagram illustrating a layout of the memory cell of the semiconductor memory device according to the above-described embodiment.

FIG. 4 illustrates the case of this embodiment and is a layout of a case where two three bit line-type memory cells MCs are aligned in the column direction. The case of this embodiment, similarly to the comparative example, can be configured by only continuously arranging the layout illustrated in FIG. 3A and a layout that is line symmetrical to the above-described layout with respect to axis a-a' illustrated in FIG. 4 as the symmetrical axis in the column direction.

<Configuration of Read Circuit>

Next, a read circuit that can be used in a case where the above-described two bit line-type memory cells MCs are used will be described, and, as a premise of a read circuit 4 according to this embodiment, a read circuit 4 according to the comparative example will be described.

Figure 30:
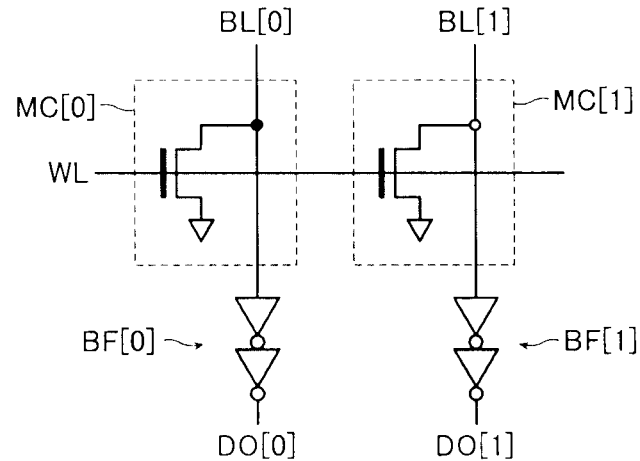
FIG. 30 is a diagram illustrating a configuration example of a read circuit for the memory cell of the semiconductor memory device according to the above-described comparative example.
Figures 31, 32, 33:
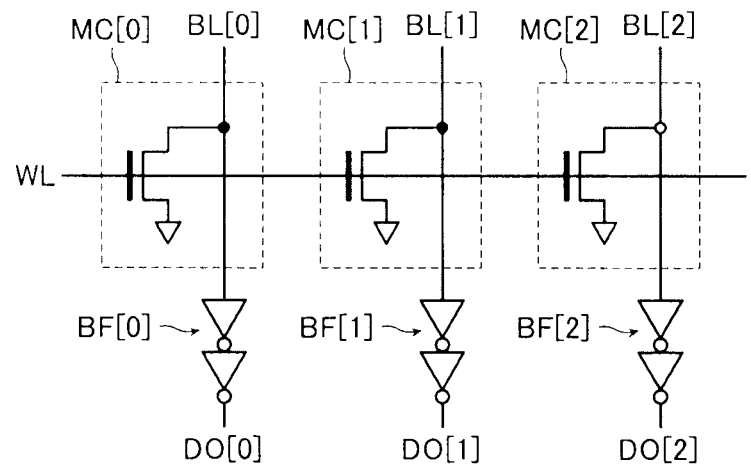
FIG. 31 is a diagram illustrating the relation between the state of the memory cell of the semiconductor memory device according to the above-described comparative example and output data thereof.
FIG. 32 is a diagram illustrating a configuration example of a read circuit of a semiconductor memory device according to a comparative example of the second embodiment.
FIG. 33 is a diagram illustrating a relation between the state of the memory cell of the semiconductor memory device according to the above-described comparative example and output data thereof.

FIG. 30 is the configuration of the read circuit according to the comparative example. In the case of the comparative example, as illustrated in FIG. 31, the voltage levels appearing in the bit lines BL[0] and BL[1] are in direct correspondence with output data D0[0] and D0[1]. Accordingly, in the case of the comparative example, buffer circuits BF[0] and BF[1] as read circuits are connected to end portions of the bit lines BL[0] and BL[1].

In contrast to this, in the case of this embodiment, in order to acquire two-bit data from the voltage levels of three bit lines BL0 to BL2, it is necessary to arrange an encoding circuit in the read circuit 4.

Figure 5:
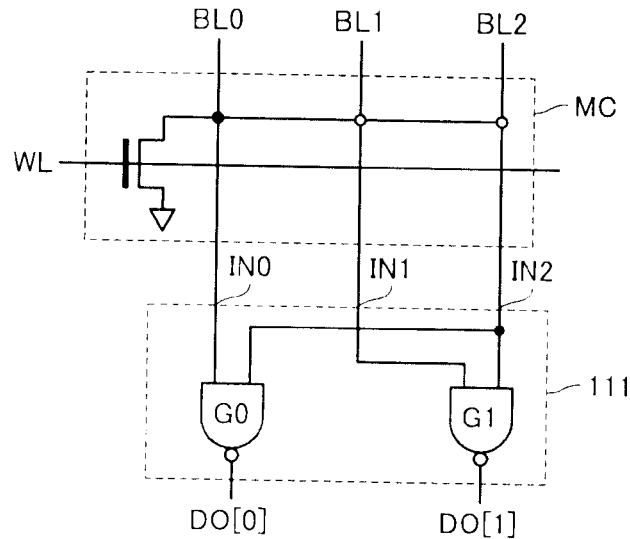
FIG. 5 is a diagram illustrating a configuration example of a read circuit for the memory cell of the semiconductor memory device according to the above-described embodiment.

FIG. 5 is a diagram illustrating a configuration example of the encoding circuit of the read circuit 4 according to this embodiment.

The encoding circuit 111 illustrated in FIG. 5 is a circuit that receives the voltage levels of bit lines BL0 to BL2 from inputs IN0 to IN3, encodes the voltage levels into output data D0[0] and D0[1] based on a combination of the voltage levels of the bit lines BL0 to BL2, and outputs the output data.

The encoding circuit 111 includes a NAND gate G0 that has the bit lines BL0 and BL2 as inputs and an NAND gate G1 that receives the bit lines BL1 and BL2 as inputs. By employing such a configuration, the output of the NAND gate G0 is configured to be the output data D0[0], and the output of the NAND gate G1 is configured to be the output data D0[1].

Figures 6, 7:
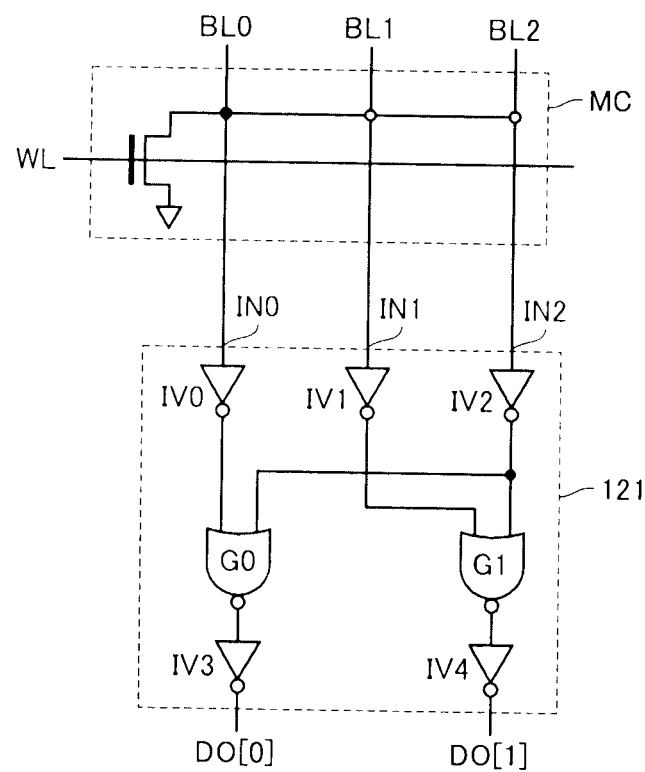
FIG. 6 is a diagram illustrating a relation between the state of the memory cell of the semiconductor memory device according to the above-described embodiment and output data thereof.
FIG. 7 is a diagram illustrating a configuration example of a read circuit of the semiconductor memory device according to the above-described embodiment.

Here, the output data D0[0] and the output data D0[1] are as illustrated in FIG. 6 in accordance with the connection states of the cell transistor CT of the memory cell MC and the bit lines BL0 to BL2.

FIG. 7 is a diagram illustrating another configuration example of the encoding circuit of the read circuit 4 according to this embodiment. This encoding circuit 121 is a circuit that performs encoding based on a combination of the voltage levels of the bit lines BL0 to BL2 so as to acquire output data D0[0] and D0[1] and outputs the output data.

In the case of the encoding circuit 121, an inverter IV0 that uses the bit line BL0 as its input, an inverter IV1 that uses the bit line BL1 as its input, an inverter IV2 that uses the bit line BL2 as its input, a NOR gate G0 that receives the output of the inverter IV0 and the output of the inverter IV2 as its inputs, a NOR gate G1 that receives the output of the inverter IV1 and the output of the inverter IV2 as its inputs, an inverter IV3 that receives the output of the NOR gate G0 as its input, and an inverter IV4 that receives the output of the NOR gate G1 as its input are included. By employing such a configuration, the output of the inverter IV3 is configured to be the output data D0[0], and the output of the inverter IV4 is configured to be the output data D0[1].

In addition, the output data D0[0] and the output data D0[1], similarly to those of the encoding circuit 111, are as illustrated in FIG. 6 in accordance with the connection states of the cell transistor CT of the memory cell MC and the bit lines BL0 and BL1. Furthermore, in a case where the output data D0[0] and the output data D0[1] may have logics opposite to those illustrated in FIG. 6, the inverters IV3 and IV4 may be omitted.

The above-described two read circuits 4 have a configuration in which one encoding circuit 111 (or 121) is disposed for each bit line group. In contrast to this, in a configuration example of the read circuit 4 to be described next, one encoding circuit is shared by a plurality of bit line groups.

Figure 8:
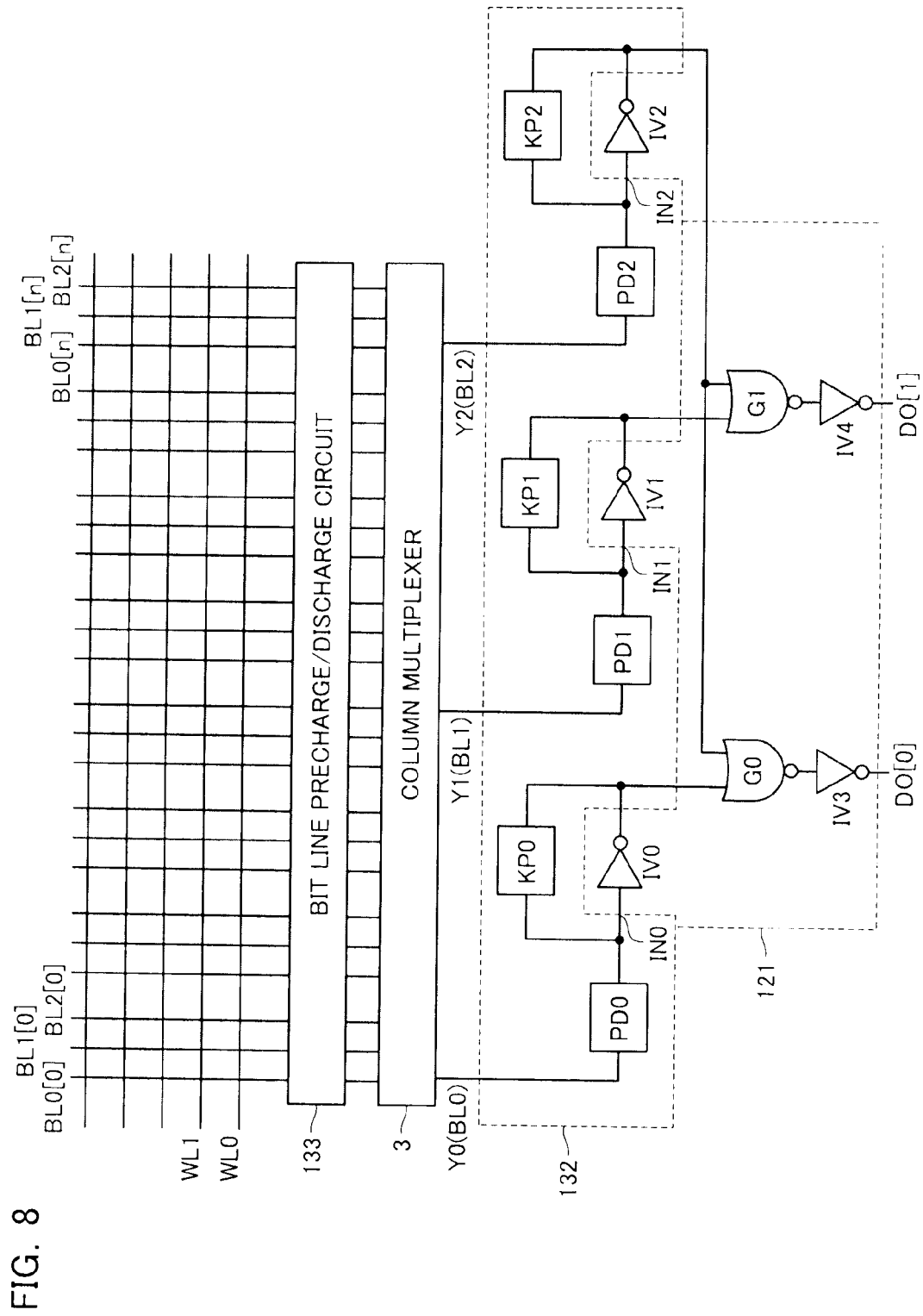
FIG. 8 is a diagram illustrating a configuration example of a column multiplexer and a read circuit of the semiconductor memory device according to the above-described embodiment.

FIG. 8 is a diagram illustrating a configuration example of a column multiplexer 3 and a read circuit 4 according to this embodiment.

The column multiplexer 3 is a circuit that selects one from among a plurality of bit line groups and sets the data of the bit lines BL0, BL1, and BL2 of the selected bit line group as outputs Y0, Y1, and Y2. In the case illustrated in FIG. 8, one column multiplexer 3 is disposed for every eight bit line groups.

The read circuit 4 includes a part circuit 132 and a bit line precharge/discharge circuit 133 in addition to the encoding circuit 121 illustrated in FIG. 7. The encoding circuit 121 is the same as described above, and thus the description thereof will not be presented here.

The bit line precharge/discharge circuit 133 is disposed on the former stage of the column multiplexer 3 and is a circuit that charges or discharges the bit line BL before data is read from the memory cell MC or after data is read out. The charge/discharge of the bit line BL after data is read out may be omitted. In such a case, when the cell transistor CT of the memory cell MC is an NMOS transistor, the discharge circuit may be omitted, and, when the cell transistor CT of the memory cell MC is a PMOS transistor, the precharge circuit may be omitted.

The part circuit 132 includes precharge/discharge circuits PD0, PD1, and PD2 that are disposed between the output Y0 of the column multiplexer 3 and the input IN0 of the encoding circuit 121, between the output Y1 of the column multiplexer 3 and the input IN1 of the encoding circuit 121, and between the output Y2 of the column multiplexer 3 and the input IN2 of the encoding circuit 121.

The precharge/discharge circuits PD0, PD1, and PD2 can charge or discharge the bit lines BL0 to BL2 of the selected bit line group through the column multiplexer 3. Accordingly, by arranging the precharge/discharge circuits PD0, PD1, and PD2, the bit line precharge/discharge circuit 133 may be omitted.

In addition, the part circuit 132 includes keeper circuits KP0, KP1, and KP2 that are connected between the inputs and the outputs of the inverters IV0, IV1, and IV2 of the encoding circuit 121. The keeper circuits KP0, KP1, and KP2 stabilize the inputs N0, N1, and IN2 of the encoding circuit 121 and reduce the occurrence of erroneous reading-out due to a leakage current flowing though the bit line BL. In a case where the cell transistor CT of the memory cell MC is an NMOS transistor, the keeper circuit KP can be configured by a PMOS transistor, and, in a case where the cell transistor CT of the memory cell MC is a PMOS transistor, the keeper circuit KP can be configured by an NMOS transistor.

Furthermore, the part circuit 132 is an arbitrary circuit and may be omitted.

Figure 9:
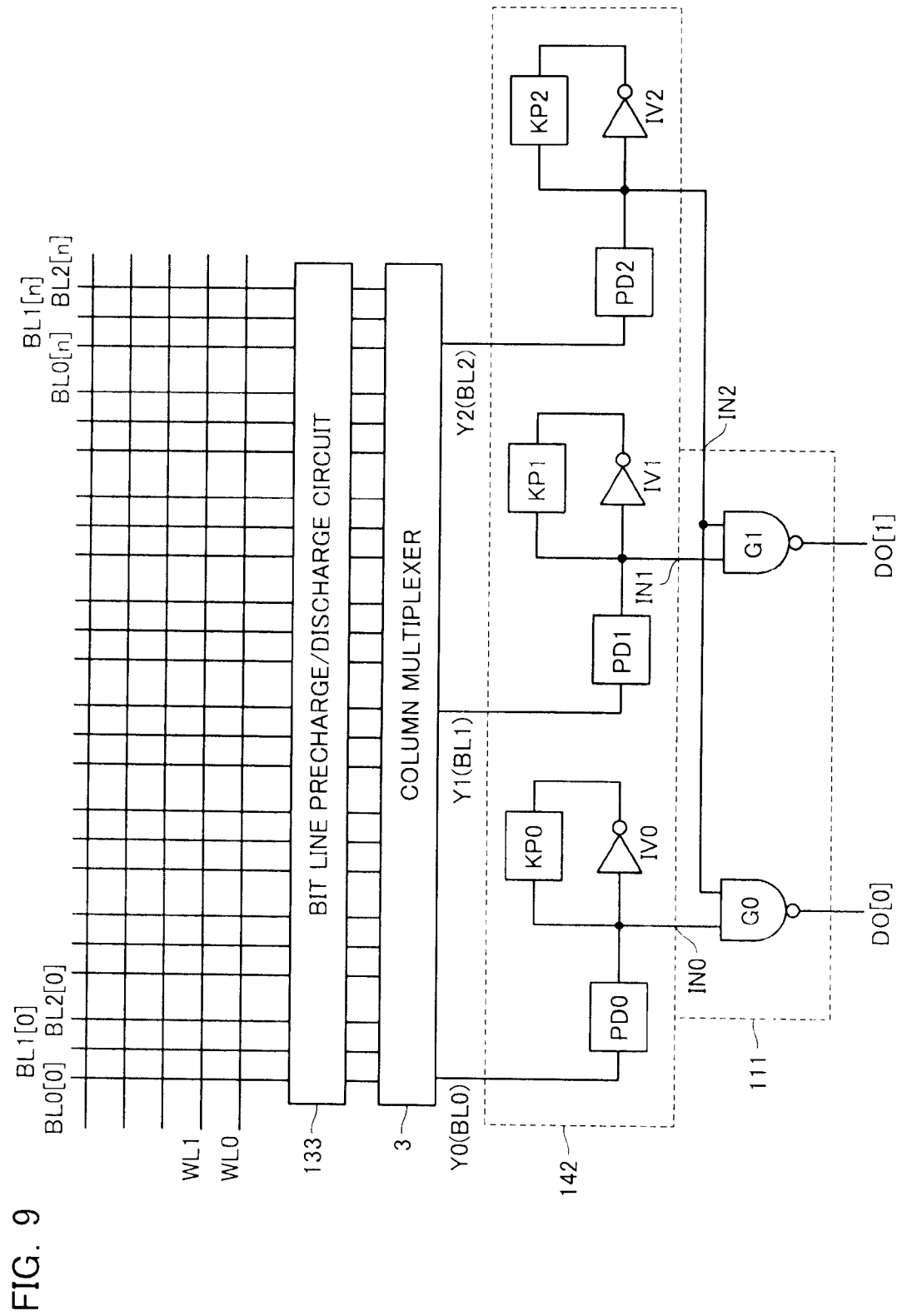
FIG. 9 is a diagram illustrating a configuration example of a column multiplexer and a read circuit of the semiconductor memory device according to the above-described embodiment.

FIG. 9 is a diagram illustrating another configuration example of the column multiplexer 3 and the read circuit 4 according to this embodiment.

The column multiplexer 3 is the same as described above, and thus, the description thereof will not be presented here.

The read circuit 4 includes a part circuit 142 in addition to the encoding circuit 111 illustrated in FIG. 5 and the bit line precharge/discharge circuit 133 illustrated in FIG. 8. Here, since the encoding circuit 111 and the bit line precharge/discharge circuit 133 are the same as described above, the description thereof will not be presented here.

The part circuit 142 includes precharge/discharge circuits PD0, PD1, and PD2 that are disposed between the output Y0 of the column multiplexer 3 and the input IN0 of the encoding circuit 111, between the output Y1 of the column multiplexer 3 and the input IN1 of the encoding circuit 111, and between the output Y2 of the column multiplexer 3 and the input IN2 of the encoding circuit 111.

In addition, the part circuit 142 includes an inverter IV0 that is connected to the output Y0 of the column multiplexer 3 and a keeper circuit KP0 that is connected in parallel therewith, an inverter IV1 that is connected to the output Y1 of the column multiplexer 3 and a keeper circuit KP1 that is connected in parallel therewith, and an inverter IV2 that is connected to the output Y2 of the column multiplexer 3 and a keeper circuit KP2 that is connected in parallel therewith. The keeper circuits KP0, KP1, and KP2 are circuits that stabilize the inputs IN0, IN1, and IN2 of the encoding circuit 111 through a combination with the inverters IV0, IV1, and IV2.

Here, the part circuit 142, similarly to the part circuit 132 illustrated in FIG. 8, is an arbitrary circuit and may be omitted.

Figure 10:
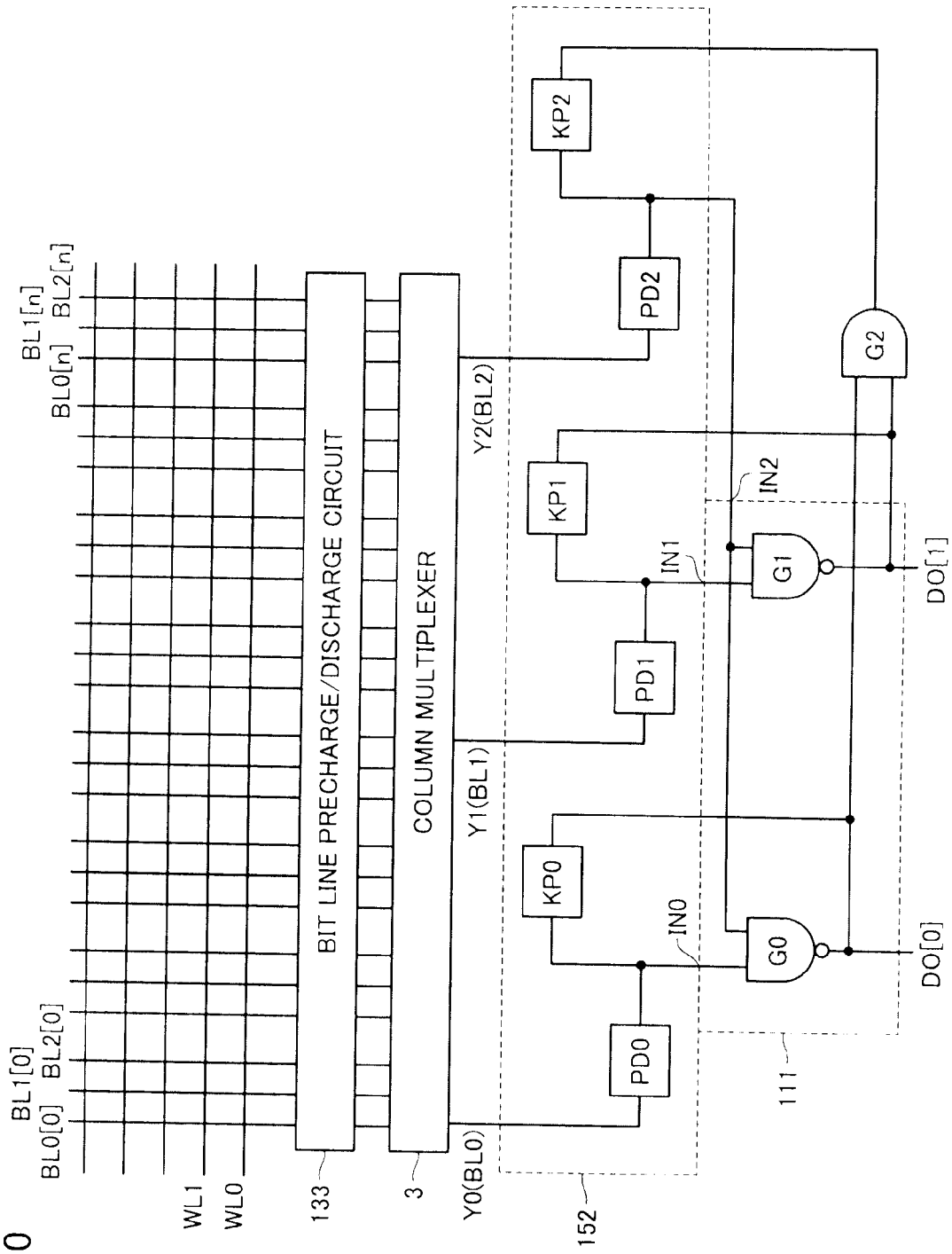
FIG. 10 is a diagram illustrating a configuration example of a column multiplexer and a read circuit of the semiconductor memory device according to the above-described embodiment.

FIG. 10 is a diagram illustrating another configuration example of the column multiplexer 3 and the read circuit 4 according to this embodiment.

Since the column multiplexer 3 is the same as described above, the description thereof will not be presented here.

The read circuit 4 includes a part circuit 152 in addition to the encoding circuit 111 illustrated in FIG. 5 and the bit line precharge/discharge circuit 133 illustrated in FIG. 8. The encoding circuit 111 and the bit line precharge/discharge circuit 133 are the same as described above, and thus the description thereof will not be presented here.

The part circuit 152 includes precharge/discharge circuits PD0, PD1, and PD2 that are disposed between the output Y0 of the column multiplexer 3 and the input IN0 of the encoding circuit 111, between the output Y1 of the column multiplexer 3 and the input IN1 of the encoding circuit 111, and between the output Y2 of the column multiplexer 3 and the input IN2 of the encoding circuit 111.

In addition, the part circuit 152 includes: an AND gate G2 that receives the output data D0[0] and D0[1] as inputs; a keeper circuit KP0 that is connected between the input IN0 of the encoding circuit 111 and the output data D0[0]; a keeper circuit KP1 that is connected between the input IN1 of the encoding circuit 111 and the output data D0[1]; and a keeper circuit KP2 that is connected between the input IN2 of the encoding circuit 111 and the output of the AND gate G2. The keeper circuits KP0, KP1, and KP2 are circuits that stabilize the inputs of the encoding circuit 111.

Here, the part circuit 152, similarly to the part circuit 132 illustrated in FIG. 8, is an arbitrary circuit and may be omitted.

As above, in the case of this embodiment, since encoding for three bit lines BL0 to BL2 is required so as to acquire data D0[0] and data D0[1] as two values, it is necessary to arrange the encoding circuit 111 (or 121) as illustrated in any of FIGS. 5 and 7 to 10 in the read circuit 4. As a result, according to the embodiment in which the number of gate stages is increased from that of the comparative example, a delay time that occurs due to the read circuit 4 becomes large.

However, as described above, by increasing the gate width W of the cell transistor CT of the memory cell MC by three times, sufficient improvement of the reading speed is expected, and accordingly, the reading time can be shortened even when the delay time due to the read circuit 4 is considered.

In addition, in the configuration examples illustrated in FIGS. 8 to 10 out of the configuration examples of the read circuit 4, the encoding circuit 111 (or 121) is configured to be shared by a plurality of bit line groups, and accordingly, the circuit area can be decreased from those of the configuration examples illustrated in FIGS. 5 and 7.

As above, according to this embodiment, the read operation can be performed at a speed higher than that of the comparative example while the same circuit area and the same memory capacity as those of the Second Embodiment In the first embodiment, the semiconductor memory device has been described which uses the two bit line-type memory cell MC having a memory capacity of one bit. In contrast to this, in a second embodiment, a semiconductor memory device that uses a memory cell MC having a memory capacity of three bits will be described.

First, as a premise for describing the memory cell MC according to this embodiment, the configuration of a memory cell MC according to a comparative example will be described.

FIG. 32 is a circuit diagram of the memory cell MC according to a comparative example of the second embodiment.

In the comparative example, as illustrated in FIG. 32, eight connection states, as illustrated in FIG. 33, are produced based on a combination of the connection states of the cell transistors CTs of the memory cells MC[0] to MC[2] and the bit lines BL[0] to BL[2] by using three one bit line-type memory cells MC[0] to MC[2], and three bit data is stored therein.

Figure 34:
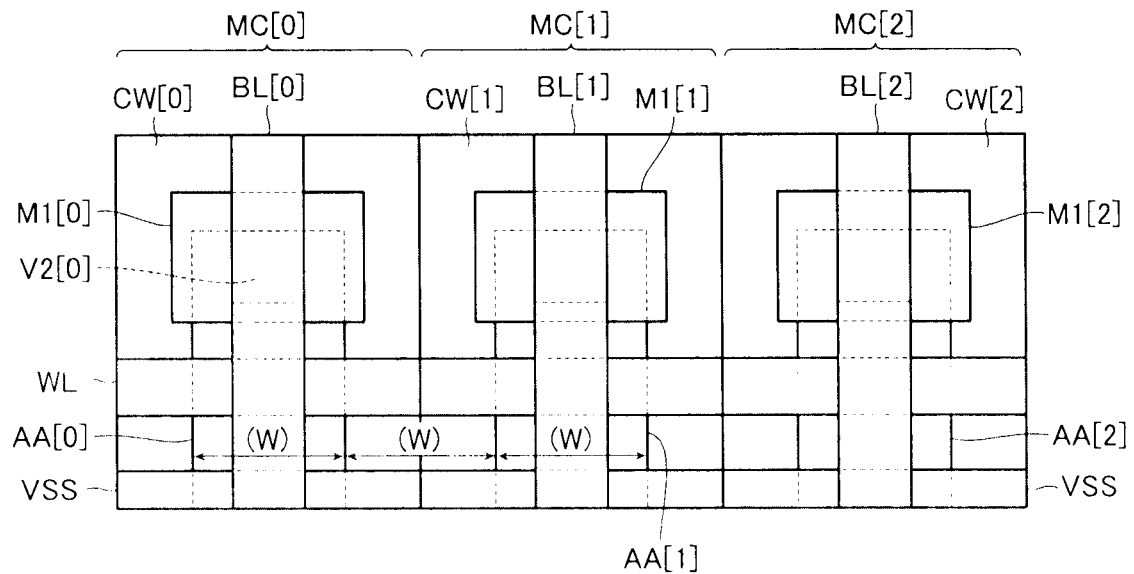
FIG. 34 is a diagram illustrating a layout of the memory cell of the semiconductor memory device according to the above-described comparative example.

FIG. 34 is a diagram illustrating the layout of the memory cells MCs illustrated in FIG. 32.

In the case of the comparative example illustrated in FIG. 34, in addition to the layout illustrated in FIG. 28, a layout that is similar to the layout of the memory cell MC[0] located on the cell well CW[0] or the memory cell MC[1] located on the cell well CW[1], which is illustrated in FIG. 28, may be formed so as to be adjacent thereto in the row direction.

In addition, the width of active areas AA[0] to AA[2] in the row direction and the width of a space between the active area AA[0] and the active area AA[1] or between the active area AA[1] and the active area AA[2] in the row direction, similarly to that of the layout illustrated in FIG. 28, is assumed to be W.

In the case of the above-described layout, the gate width of each one of the cell transistors CTs of the memory cells MC[0] to MC[2] is the width W of each one of the active areas AA[0] to AA[2] in the row direction.

Next, the configuration of the memory cell MC according to this embodiment will be described.

Figures 11, 12:
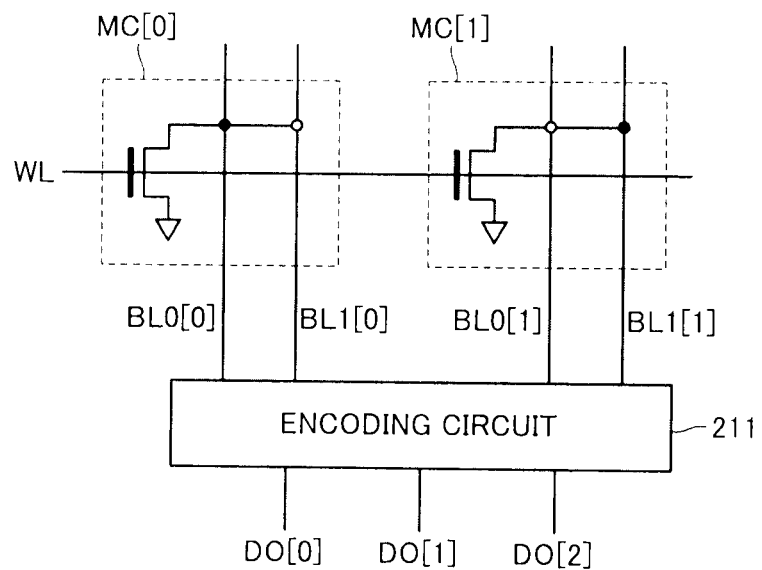
FIG. 11 is a diagram illustrating a configuration example of a read circuit of a semiconductor memory device according to a second embodiment.
FIG. 12 is a diagram illustrating the relation between the state of a memory cell of the semiconductor memory device according to the above-described embodiment and output data thereof.

FIG. 11 is a diagram illustrating the configuration of a memory cell array 1 and a read circuit 4 according to the second embodiment.

The semiconductor memory device according to this embodiment includes a memory cell array 1 in which two bit line-type memory cells MCs are arranged and a read circuit 4 that includes an encoding circuit 211 disposed at the end portion of the bit line BL.

In the case of this embodiment, as illustrated in FIG. 11, a memory capacity of three bits is secured by using two two-bit line-type memory cells MC[0] and MC[1].

The memory cell MC[j] (j=0 or 1) includes three different connection states including a state in which the cell transistor CT is not connected to any one of the bit lines BL0[j] and BL1[j] and states in which the cell transistor CT is connected to only specific one of the bit lines. Accordingly, in a case where the two two-bit line-type memory cells MC[0] and MC[1] are combined, as illustrated in FIG. 12, a total of nine memory states are formed.

The encoding circuit 211 of the read circuit 4, as illustrated in FIG. 12, receives data of bit lines BL0[0], BL1[0] and bit lines BL0[1] and BL1[1] as inputs, performs encoding based on the above-described nine memory states so as to acquire output data D0[0], D0[1], and D0[2], and outputs the output data.

In addition, in a case where two two-bit line-type memory cells MC are combined, as described above, nine memory states are produced. Accordingly, in a case where three bit output data D0 is assigned, like (BL0[0], BL1[1], BL0[1], BL1[1])=(1, 0, 1, 0) illustrated in FIG. 12, a connection state needs to be considered to which the output data D0 is not assigned. However, the connection state to which the output data D0 is not assigned may be freely selected from among the nine connection states based on the configuration of the encoding circuit 211.

Figure 13A:
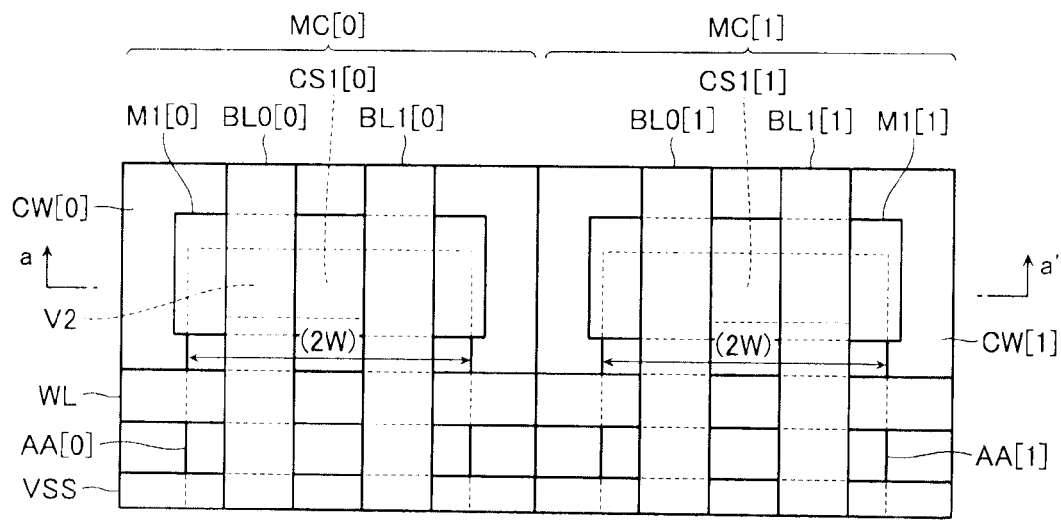
FIG. 13A is a diagram illustrating a layout of the memory cell of the semiconductor memory device according to the above-described embodiment.
Figure 13B:
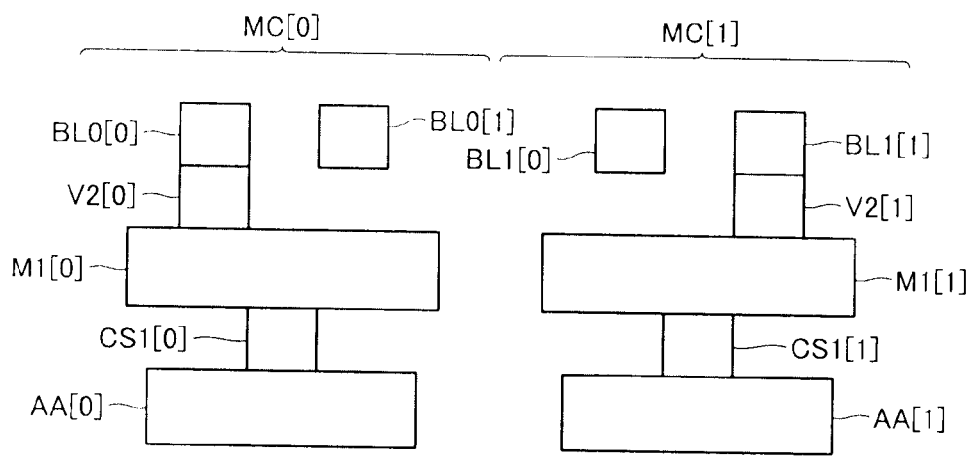
FIG. 13B is a diagram illustrating a cross-section of the layout of the memory cell of the semiconductor memory device according to the above-described embodiment.

FIGS. 13A and 13B are diagrams illustrating the layout of the memory cell MC illustrated in FIG. 12. FIG. 13A is a plan view when viewed in the stacking direction, and FIG. 13B is a cross-sectional view taken along line a-a' illustrated in FIG. 13A. Here, FIG. 13A is a layout that is on the premise of forming the memory cell on a well having the same size as that of the layout of the comparative example illustrated in FIG. 34.

In the case of the embodiment illustrated in FIGS. 13A and 13B, the memory cells MC[0] and MC[1], as illustrated below, are formed on two cell wells CW[0] and CW[1] that are aligned in the row direction.

In other words, an active area AA[j] is formed in the cell well CW[j] (j=0 or 1). Here, the width of the active area AA[j] in the row direction is twice the width 2×W of the active area AA[0] or the like of the comparative example illustrated in FIG. 34.

Over the active areas AA[0] and AA[1] located over the cell wells CW[0] and CW[1], the ground wire VSS is formed which extends over the active areas AA[0] and AA[1] in the row direction. The ground wire VSS is electrically connected to the active area AA[j] through a via CS0[j] extending in the stacking direction.

Over the active area AA[j], a metal wiring M1[j] is formed which has a width of a same level as that of the width of the active area AA[j] in the row direction. The metal wiring M1[j] is electrically connected to the active area AA[j] through two vias CS1[j] that extend in the stacking direction. Over the metal wiring M1[j], two bit lines BL0[j] and BL1[j], which extend in the column direction, are formed.

Furthermore, as illustrated in FIG. 11, in a case where the connection state of the memory cells MC[0] and MC[1] is set as (BL0[0], BL1[0], BL0[1], BL1[1])=(0, 1, 1, 0), as illustrated in FIGS. 13A and 13B, it may be configured such that the bit line BL0[0] and the metal wiring M1[0] are electrically connected to each other through a via V2[0] that is located in the upper layer, and the bit line BL1[1] and the metal wiring M1[1] are connected to each other through a via V2[1] that is located in the upper layer.

In addition, over the active areas AA[0] and AA[1], a word line WL that extends over the active areas AA[0] and AA[1] in the row direction is formed between the ground wire VSS and the metal wirings M1[0] and M1[1] in the column direction, when viewed in the stacking direction.

In the case of the above-described layout, the gate width of the cell transistor CT of the memory cell MC[j] is the width 2×W of the active area AA[j] in the row direction.

In other words, compared to a case where the memory capacity of three bits is secured by using three one bit line-type memory cells MC as in the comparative example, in a case where the memory capacity of three bits is secured by using two two-bit line-type memory cells MC as in this embodiment, the gate width of the cell transistor CT in the row direction can be configured to be long while maintaining the same circuit area and the same storage capacity as those of the comparative example. In the case of the layout illustrated in FIG. 13A, since the gate width of the cell transistor is increased by two times, it can be achieved that the reading speed is improved by two times.

Third Embodiment

In a third embodiment, an application example of the two bit line-type memory cells MC will be described which has also been described in the second embodiment.

Figure 35:
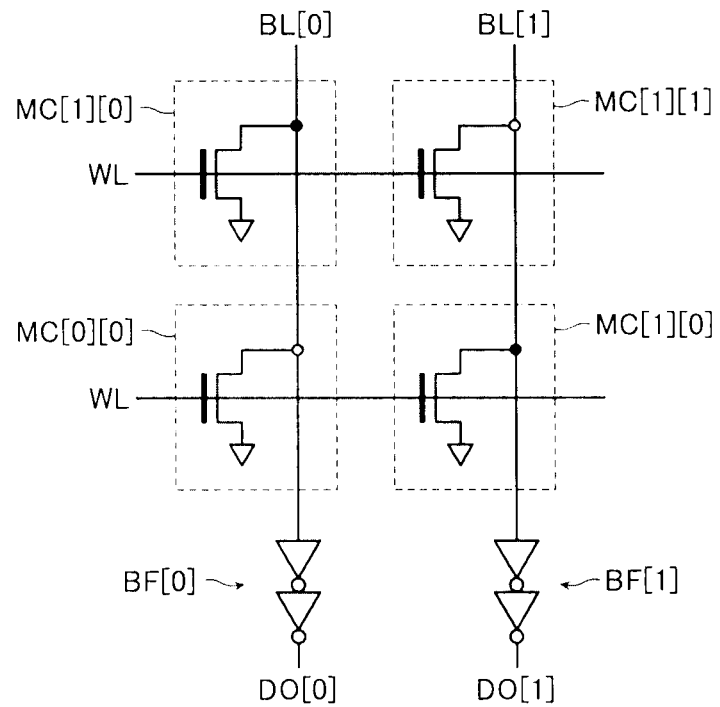
FIG. 35 is a diagram illustrating a configuration example of a memory cell array and a read circuit of the memory cell of a semiconductor memory device according to a comparative example of the third embodiment.

FIG. 35 is a diagram illustrating the configuration of a memory cell array 1 and a read circuit 4 of a semiconductor memory device according to a comparative example of the third embodiment.

The semiconductor memory device according to this comparative example includes a memory cell array 1, in which one bit line-type memory cells MC[i][j] disposed at the intersections of the word lines WL[i] (i=0 or 1) and the bit lines BL[j] (j=0 or 1) are arranged, and buffer circuits BF[j] that is disposed at the end portion of the bit line BL[j] as a read circuit.

Since the buffer circuit BF[j] is a sense amplifier circuit of the single end type in which two inverters are connected in series, it is not operated unless the voltage applied to the bit line BL[j] drops down to a level of Vdd/2. Accordingly, it is difficult to implement a high-speed read operation.

Figure 14:
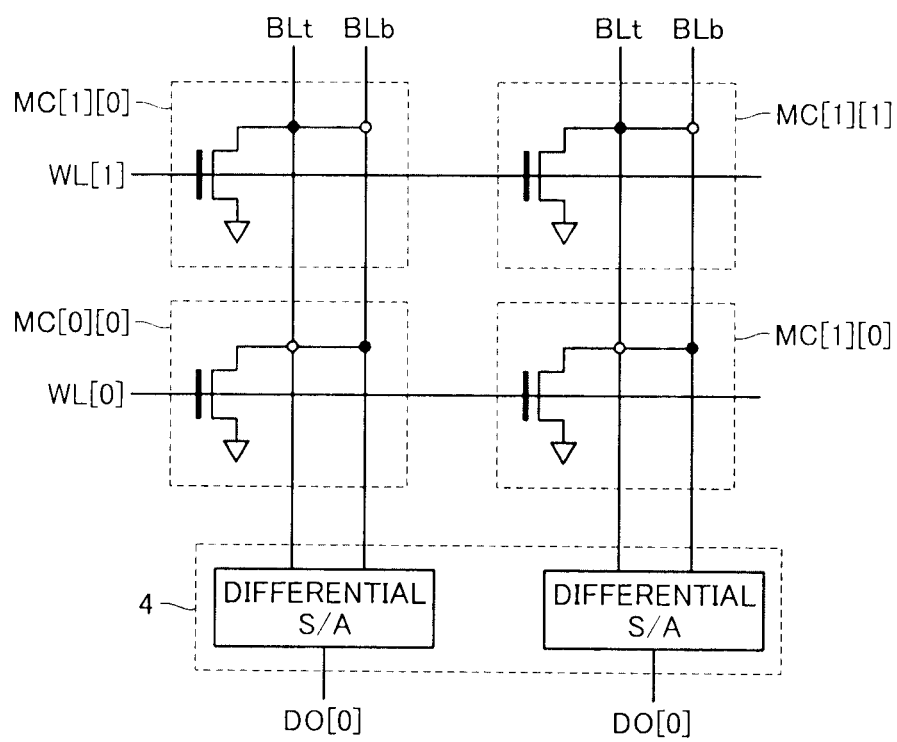
FIG. 14 is a diagram illustrating a configuration example of a memory cell array and a read circuit of a semiconductor memory device according to a third embodiment.

Thus, in the third embodiment, as illustrated in FIG. 14, each memory cell MC[i][j] of the comparative example is replaced by a memory cell MC[i][j] of the two bit line type in which bit lines BLt[j] and BLb[j] are set as a bit line group. In addition, the read circuit 4 according to this embodiment includes a differential sense amplifier circuit DF[j] that is configured to have the bit lines BLt[j] and BLb[j] as its inputs for every bit line group.

Each memory cell MC[i][j], differently from that of the second embodiment, stores one bit data therein by using two connection states including a state in which the cell transistor CT of the memory cell MC is connected only to the bit line BLt[j] and a state in which the cell transistor CT is connected only to the bit line BLb[j]. Accordingly, by selecting the memory cell MC[i][j], an electric potential appears in the bit lines BLt[j] and BLb[j] in accordance with the connection state of the memory cell MC[i][j]. Then, when the electric potential difference appearing in the bit lines BLt[j] and BLb[j] has a predetermined value (for example, about 100 mV), the differential sense amplifier DF can read out one bit data by detecting the electric potential difference.

As above, in this embodiment, by using the differential sense amplifier DF that operates at a speed higher than the sense amplifier of the single end type in the read circuit 4, it can be achieved that the read operation is performed at a speed higher than that of the comparative example.

In addition, compared to a case where data read is implemented through differential sensing as in this embodiment by using two one bit line-type memory cells MCs, the number of cell transistors CT is decreased by a half so as to decrease the circuit area, and the gate width of the cell transistor CT can be widened, whereby a high-speed read operation can be implemented.

As above, according to this embodiment, a high-speed read operation that is performed at a speed higher than that of the case where the one bit line-type memory cells MCs and the sense amplifier of the single end type are combined can be realized. In addition, a semiconductor memory device can be realized which has a smaller circuit area and a wider gate width of the cell transistor than those of a case where the one bit line-type memory cells MCs and the differential-type sense amplifier are combined.

In addition, the memory cell MC of this embodiment can employ the layout of the memory cell MC according to the second embodiment that is illustrated in FIGS. 13A and 13B without any modification.

Fourth Embodiment

A fourth embodiment is a modified example of the first and second embodiments.

In the first and second embodiments, the drain (or the source) (active area AA) of the cell transistor CT and the bit line BL are connected to each other through the via CS1 located in the lower layer, the metal wiring M1, and the via V2 located in the upper layer, and, out of these, the metal wiring M1 is formed over the bit line group when viewed in the stacking direction. In such a case, by changing the arrangement of the via V2 located in the upper layer, the connection state of the cell transistor CT and the bit line BL can be changed in an easy manner.

However, on the other hand, since the area of the metal wiring M1 is large, high parasitic capacitance between the metal wiring and the bit line BL occurs. Thus, the parasitic capacitance occurring in the bit line BL leads to the delay in the read operation.

Thus, in this embodiment, the memory cell MC according to the first or second embodiment is formed to have a layout as illustrated in FIGS. 15A, 15B to 18A, and 18B.

Figure 15A:
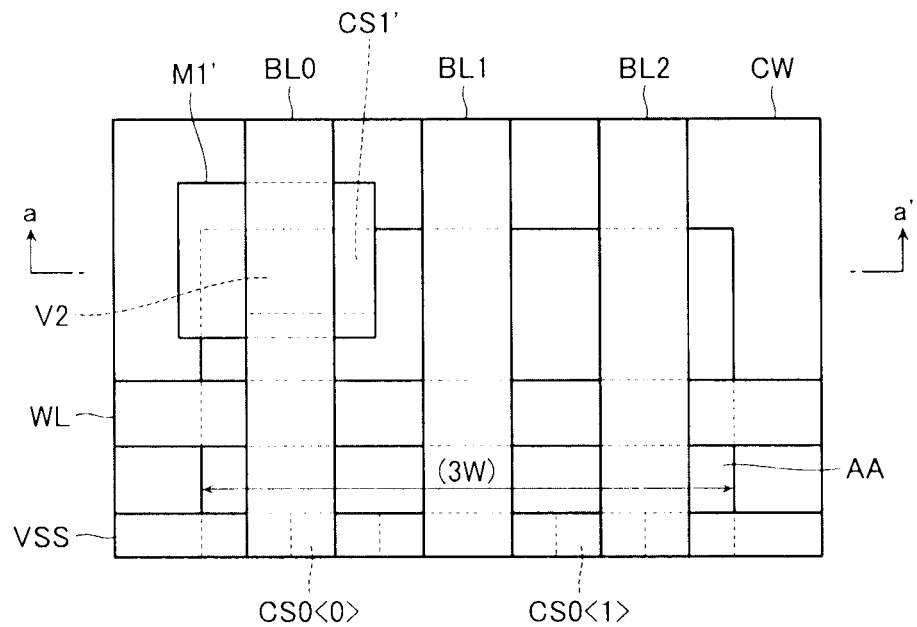
FIG. 15A is a diagram illustrating a layout of a memory cell of a semiconductor memory device according to a fourth embodiment.
Figure 15B:
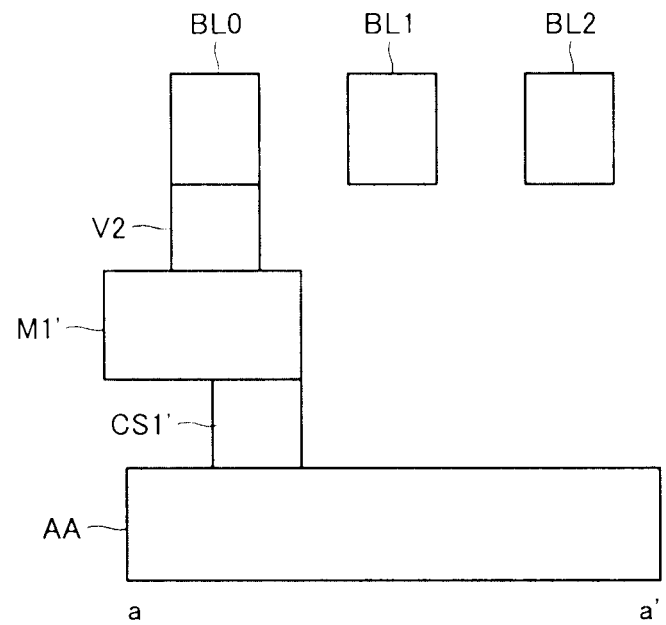
FIG. 15B is a diagram illustrating a cross-section of the layout of the memory cell of the semiconductor memory device according to the above-described embodiment.

FIGS. 15A and 15B illustrate a modified example of the first embodiment and the layout of a memory cell MC in the case of being connected to a bit line BL0 through a via connection. In the case of FIGS. 15A and 15B, differently from the first embodiment, a metal wiring M1' and a via CS1' located in the lower layer are formed only in the arrangement area of the bit line BL0 and an area close thereto so as not to be reach the arrangement areas of bit lines BL1 and BL2 when viewed in the stacking direction.

Figure 16A:
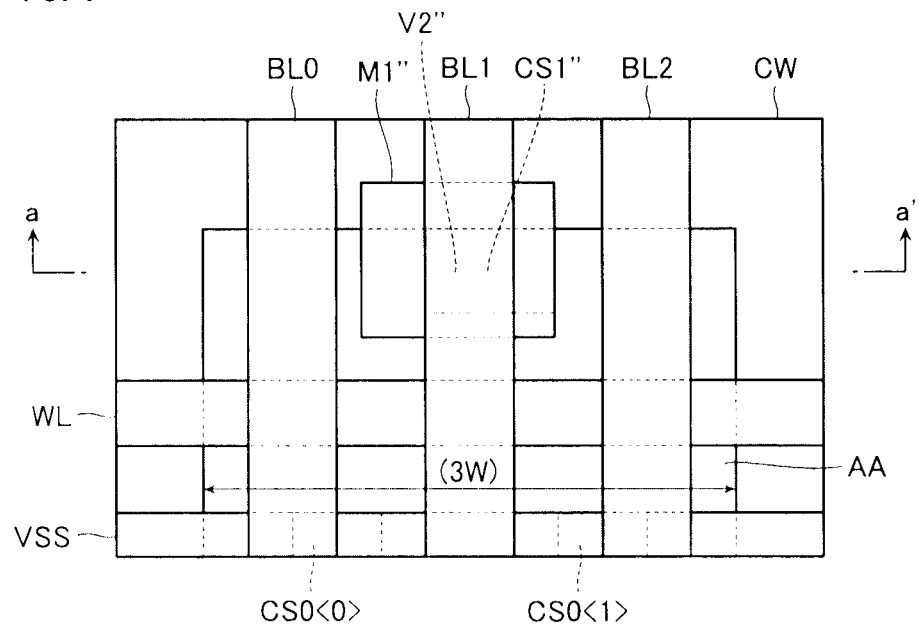
FIG. 16A is a diagram illustrating a layout of a memory cell of a semiconductor memory device according to the above-described embodiment.
Figure 16B:
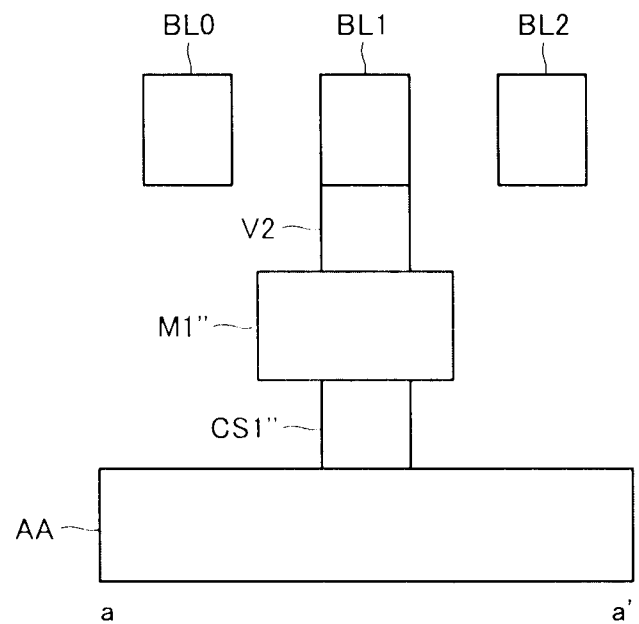
FIG. 16B is a diagram illustrating a cross-section of the layout of the memory cell of the semiconductor memory device according to the above-described embodiment.

FIGS. 16A and 16B illustrate a modified example of the first embodiment and the layout of a memory cell MC in the case of being connected to the bit line BL1 through a via connection. In the case of FIGS. 16A and 16B, differently from the first embodiment, a metal wiring M1" and a via CS1" located in the lower layer are formed only in the arrangement area of the bit line BL1 and an area close thereto so as not to reach the arrangement areas of the bit lines BL0 and BL2 when viewed in the stacking direction.

Figure 17A:
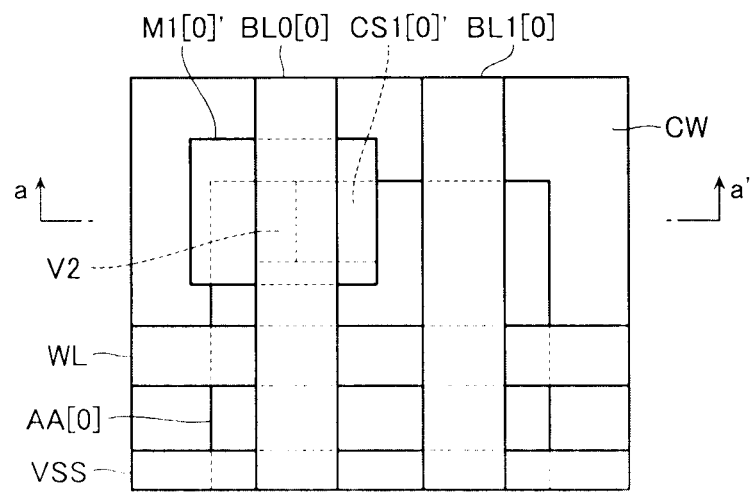
FIG. 17A is a diagram illustrating a layout of a memory cell of a semiconductor memory device according to the above-described embodiment.
Figure 17B:
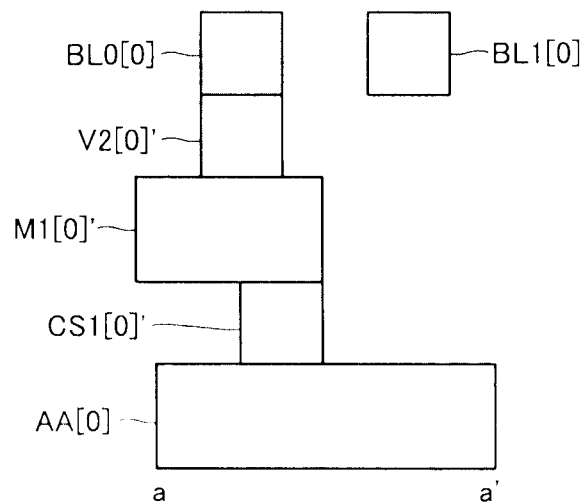
FIG. 17B is a diagram illustrating a cross-section of the layout of the memory cell of the semiconductor memory device according to the above-described embodiment.

FIGS. 17A and 17B illustrate a modified example of the second embodiment and the layout of a memory cell MC in the case of being connected to the bit line BL0 through a via connection. In the case of FIGS. 17A and 17B, differently from the second embodiment, a metal wiring M1' and a via CS1' located in the lower layer are formed only in the arrangement area of the bit line BL0 and an area close thereto so as not to reach the arrangement area of the bit line BL1 when viewed in the stacking direction.

Figure 18A:
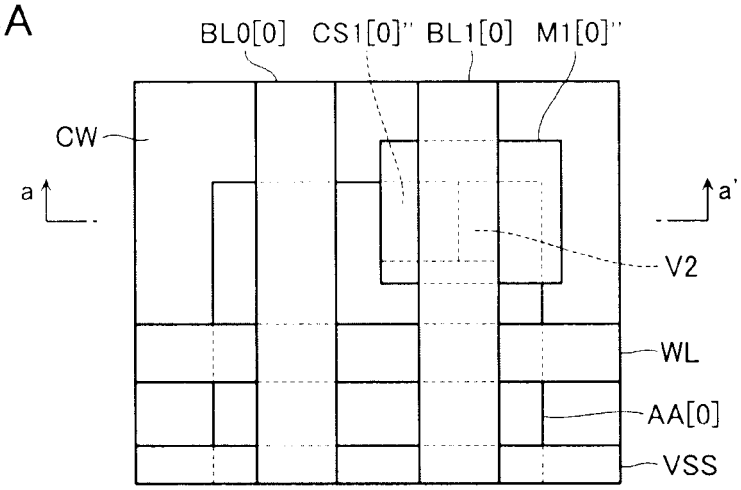
FIG. 18A is a diagram illustrating a layout of a memory cell of a semiconductor memory device according to the above-described embodiment.
Figure 18B:
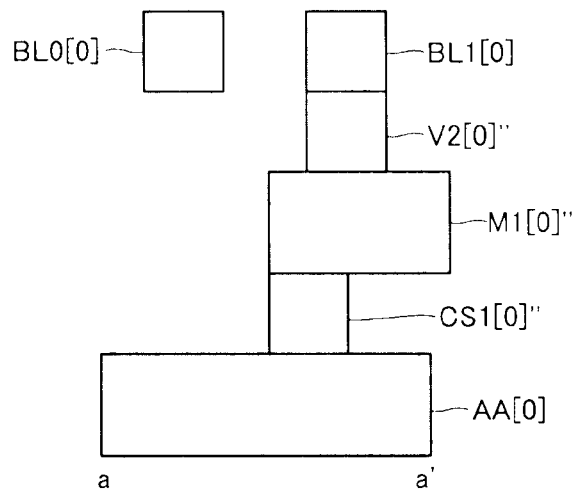
FIG. 18B is a diagram illustrating a cross-section of the layout of the memory cell of the semiconductor memory device according to the above-described embodiment.

FIGS. 18A and 18B illustrate a modified example of the second embodiment and the layout of a memory cell MC in the case of being connected to the bit line BL1 through a via connection. In the case of FIGS. 18A and 18B, differently from the second embodiment, a metal wiring M1" and a via CS1" located in the lower layer are formed only in the arrangement area of the bit line BL1 and an area close thereto so as not to reach the arrangement area of the bit line BL0 when viewed in the stacking direction.

As above, in the case of this embodiment, differently from the first and second embodiments, the metal wiring M1 is formed only on the lower side of the bit line BL that is connected to the cell transistor CT, and accordingly, the area of the metal wiring M1 can be configured to be smaller than that of the first or second embodiment.

As a result, according to this embodiment, the parasitic capacitance of the bit line BL is lower than that of the first or second embodiment, whereby a higher-speed read operation can be realized.

In addition, by forming the memory cell MC according to the third embodiment to have the layout illustrated in FIGS. 17A and 17B and FIGS. 18A and 18B, the implementation of a high-speed read operation can be realized.

Fifth Embodiment

A fifth embodiment is a modified example of the first embodiment.

Figure 19:
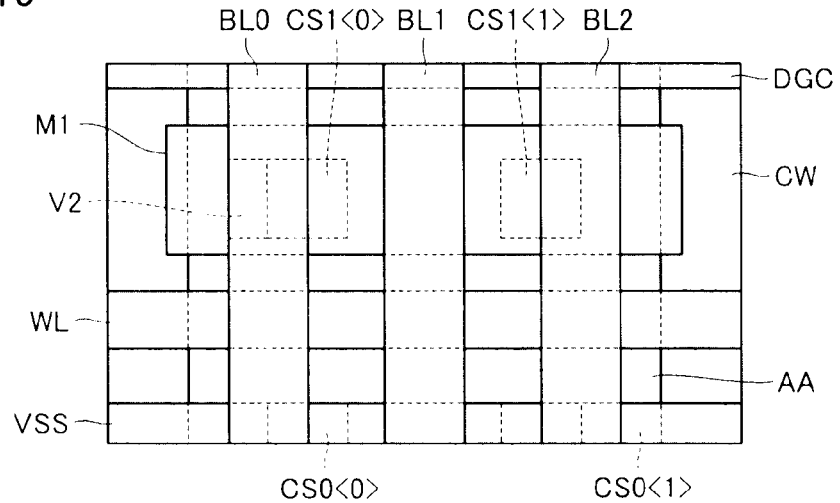
FIG. 19 is a diagram illustrating a layout of a memory cell of a semiconductor memory device according to a fifth embodiment.

FIG. 19 is a diagram illustrating the layout of one memory cell MC of a semiconductor memory device according to this embodiment. The memory cell MC according to this embodiment has a layout that is different from that of the memory cell MC according to the first embodiment illustrated in FIG. 3A in the points that an active area AA extends from one end of the layout of the memory cell MC to the other end in the column direction, and a dummy gate electrode DGC extending in the row direction is disposed at the end in the column direction.

Figure 20:
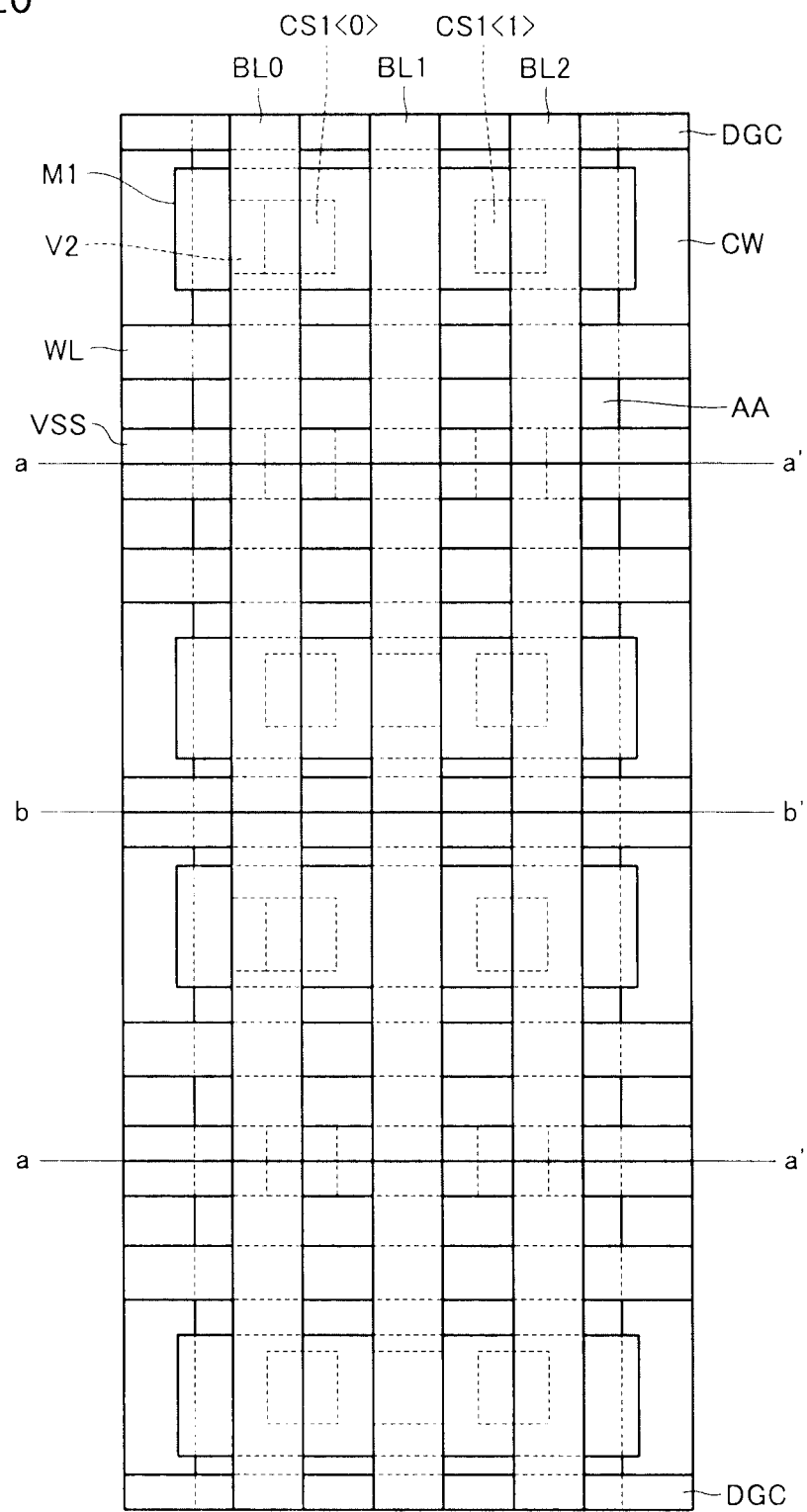
FIG. 20 is a diagram illustrating a layout of a memory cell array of the semiconductor memory device according to the above-described embodiment.

FIG. 20 is a diagram illustrating the layout of a memory cell array 1 according to this embodiment. The memory cell array 1 according to this embodiment has a configuration acquired by continuously arranging layouts in the column direction which are line symmetrical with respect to the layout illustrated in FIG. 19 using axis a-a' or axis b-b' illustrated in FIG. 20 as the symmetrical axis.

Figure 21:
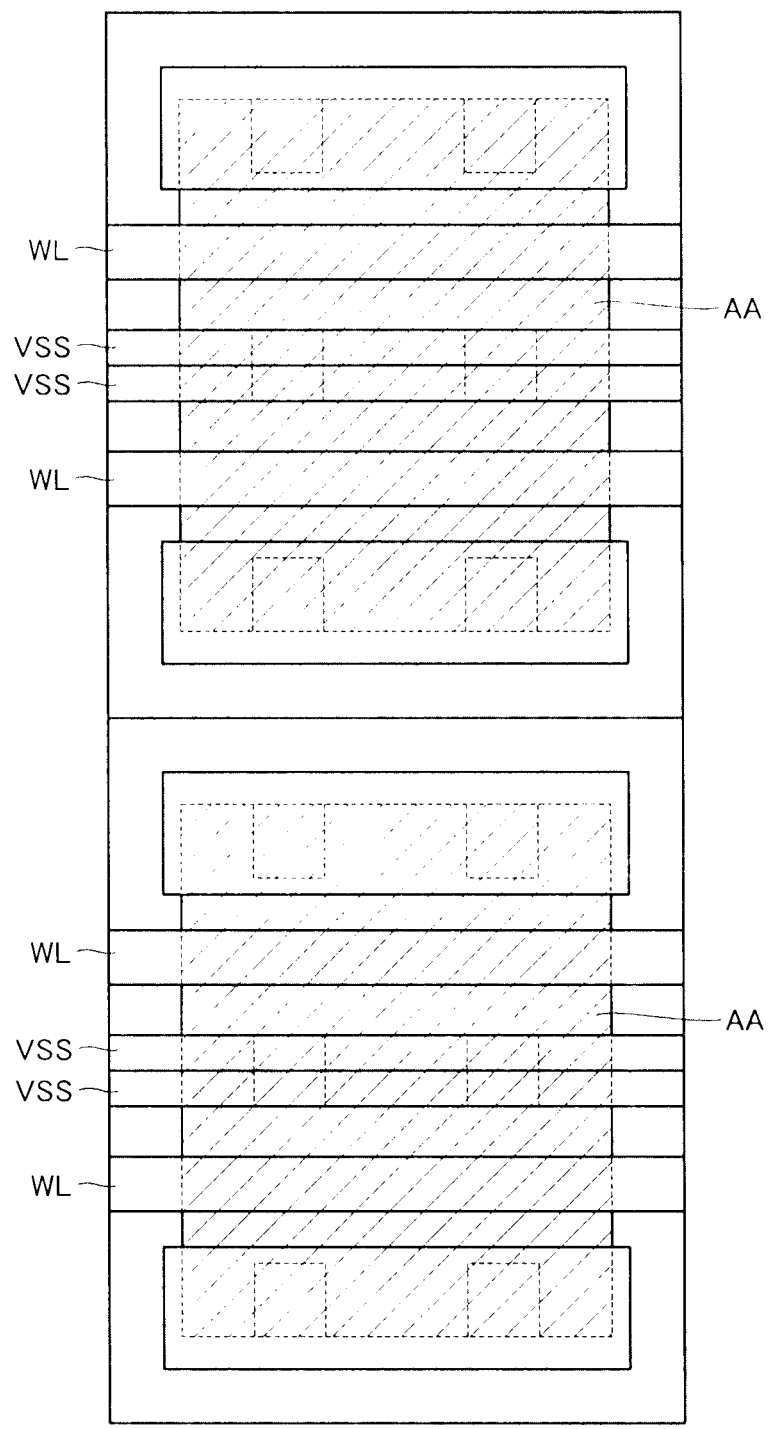
FIG. 21 is a diagram illustrating a layout of a memory cell array of the semiconductor memory device according to the first embodiment.
Figure 22:
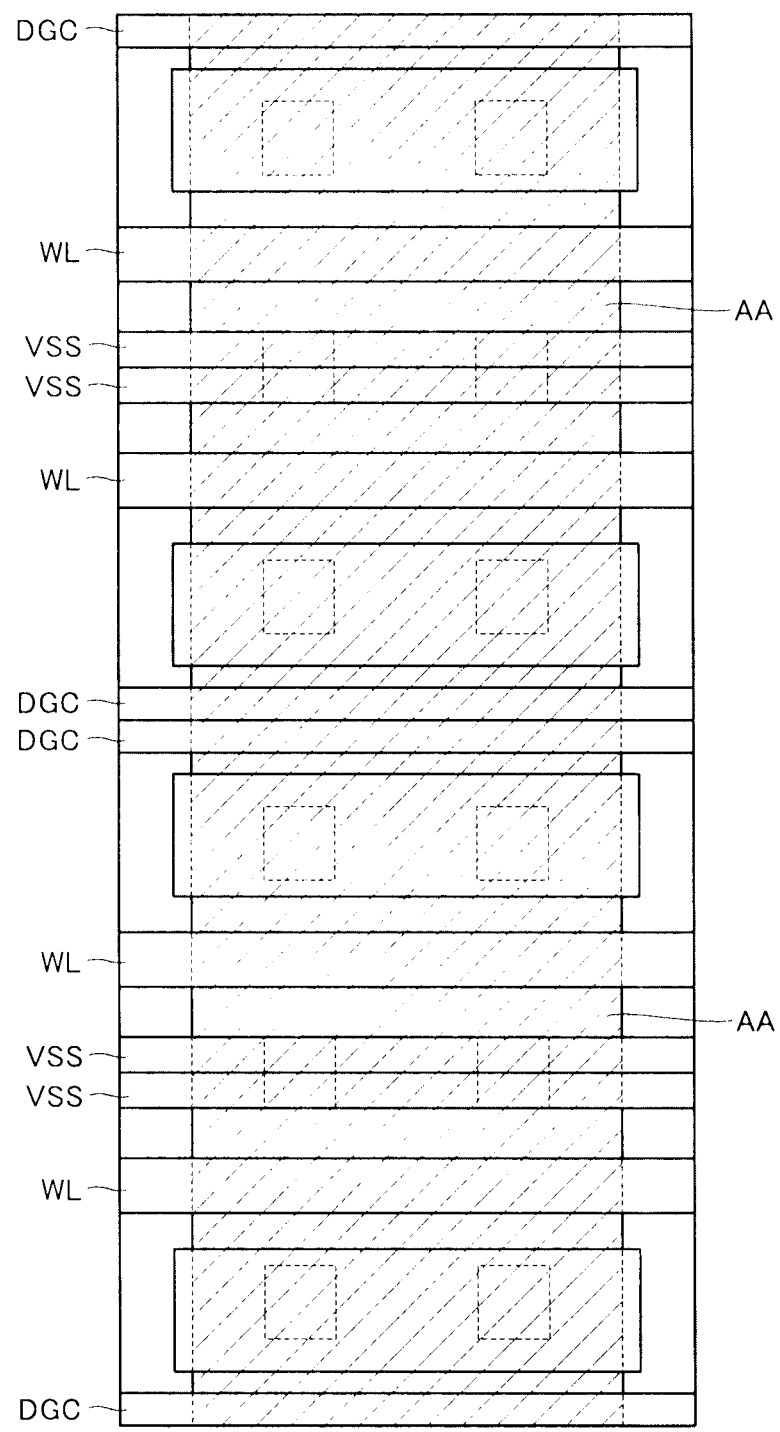
FIG. 22 is a diagram illustrating a layout of the memory cell array of the semiconductor memory device according to the fifth embodiment.

FIG. 21 is a layout acquired by excluding the bit lines BL0 to BL2 from the layout of the memory cell array 1 according to the first embodiment, and FIG. 22 is a layout acquired by excluding the bit lines BL0 to BL2 from the layout illustrated in FIG. 20.

In the case of this embodiment, since the dummy gate DGC is disposed between the memory cells MC adjacent to each other in the column direction, as denoted by diagonal lines in FIG. 21, even in a case where the active areas AA are formed to be continuous in the column direction, the cell transistors can be separated from each other.

Thus, according to this embodiment, compared to a case where the active areas are separated from each other in the column direction like the active areas AA according to the first embodiment that are denoted by diagonal lines in FIG. 22, the degradation of a cell transistor current due to STI stress can be suppressed. Accordingly, the cell transistor current larger than that of the first embodiment can be acquired, whereby the reading speed of the mask ROM can be improved.

In addition, also in the memory cell array 1 according to the second embodiment, by arranging the dummy gate electrode extending in the row direction between the memory cells adjacent to each other in the column direction like this embodiment, the active areas AA can be formed to be continuous in the column direction. As a result, as in this embodiment, the degradation of the cell transistor current due to STI stress can be suppressed, whereby the read speed can be improved.

Sixth Embodiment

In a sixth embodiment, a semiconductor memory device as a modified example of the first embodiment will be described.

Figure 23A:
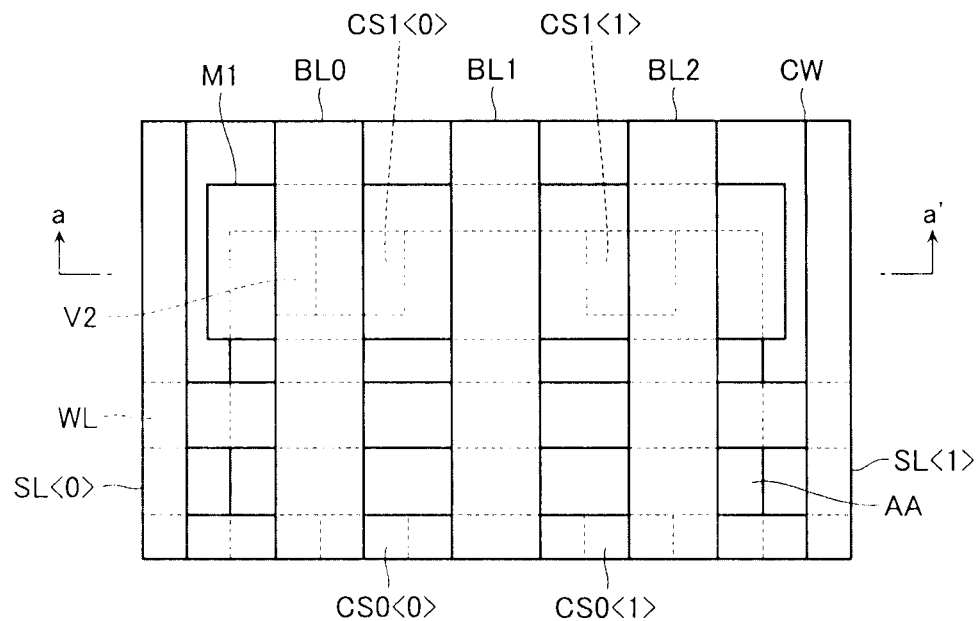
FIG. 23A is a diagram illustrating a layout of a memory cell of a semiconductor memory device according to a sixth embodiment.
Figure 23B:
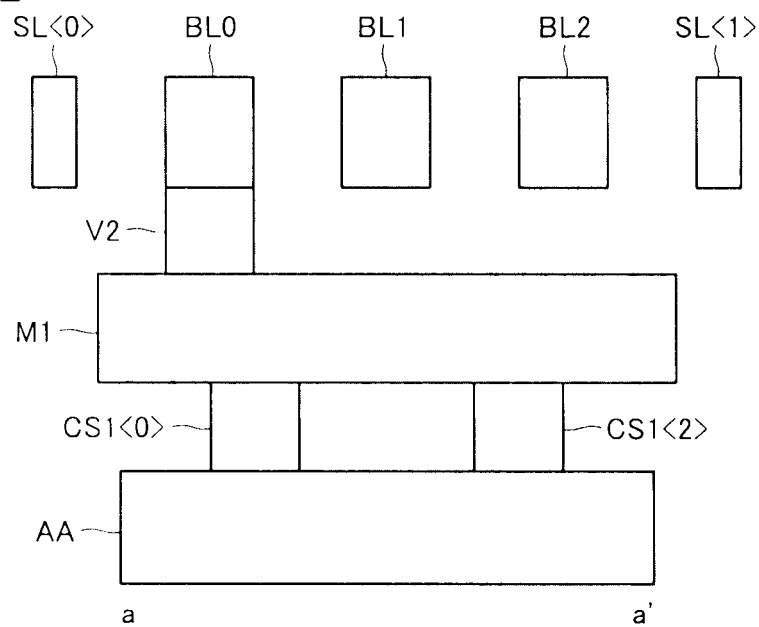
FIG. 23B is a diagram illustrating a cross-section of the layout of the memory cell of the semiconductor memory device according to the embodiment.

FIGS. 23A and 23B are diagrams illustrating the layout of a memory cell MC according to this embodiment. FIG. 23A is a plan view when viewed in the stacking direction, and FIG. 23B is a cross-sectional view taken along line a-a' illustrated in FIG. 23A.

The memory cell MC according to this embodiment has a structure acquired by arranging shield lines SL<0> and SL<1> in the memory cell MC according to the first embodiment. These shield lines SL<0> and SL<1>, as illustrated in FIGS. 23A and 23B, extend in the column direction in the same layer as that of bit lines BL0 and BL1 and are formed so as to have the bit lines BL0 to BL2 interposed therebetween. The shield lines SL<0> and SL<1> are electrically connected to the ground wire VSS or a power source line VDD to which the power source voltage Vdd is supplied. In addition, the arrangement areas of the shield lines SL<0> and SL<1> can be used as global lines in a case where the memory cell array 1 is layered. The electric potential of the global lines transit only after the data of the selected memory cell MC is determined. In other words, the global lines have the same electric potential as that of the ground wire VSS or the power source line VDD when the bit lines BL0 to BL2 transit, and the same advantages as those of the shield lines SL<0> and SL<1> can be acquired.

Figure 24:
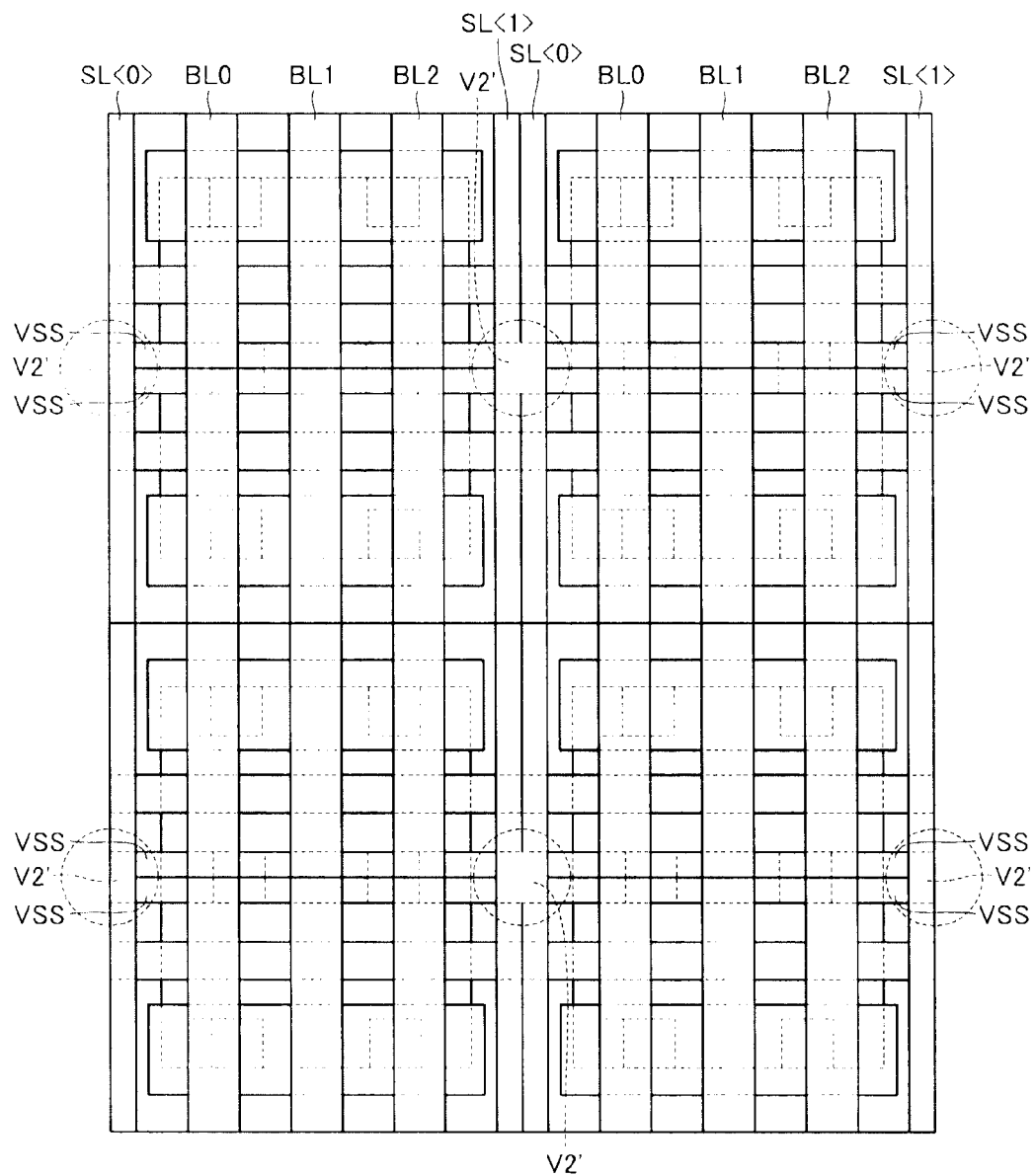
FIG. 24 is a diagram illustrating a layout of the memory cell of the semiconductor memory device according to the above-described embodiment.

FIG. 24 is a diagram illustrating a layout in the case of arranging the memory cells MC illustrated in FIGS. 23A and 23B in four rows in the column direction and in two columns in the row direction. This example is an example in a case where the shield lines SL<0> and SL<1> are connected to the ground wire VSS.

In the case of this embodiment, the shield lines SL<0> and SL<1>, as denoted by dotted-circle lines in FIG. 24, are connected to vias V2' located in the upper layer at the intersections with the ground line VSS together with the shield lines SL<1> and SL<0> of the memory cell MC adjacent thereto in the row direction. The remaining layout is similar to that of the first embodiment.

As above, in the case of this embodiment, the shield lines SL<0> and SL<1> extending in the column direction are arranged between the memory cells MC that are adjacent to each other in the row direction. Thus, according to this embodiment, not only the advantages similar to those of the first embodiment are acquired, but also an erroneous operation of the memory cell MC due to capacitive coupling can be prevented by suppressing the capacitive coupling between the bit line BL0 of the memory cell MC and the bit line BL3 of another memory cell MC that is adjacent to the memory cell MC in the row direction. Accordingly, discharge of the bit lines BL0 to BL2 after the read of data can be omitted, and therefore, an advantage of decreasing the power consumption can be acquired in a case where consecutive data read operations are performed.

Figure 25A:
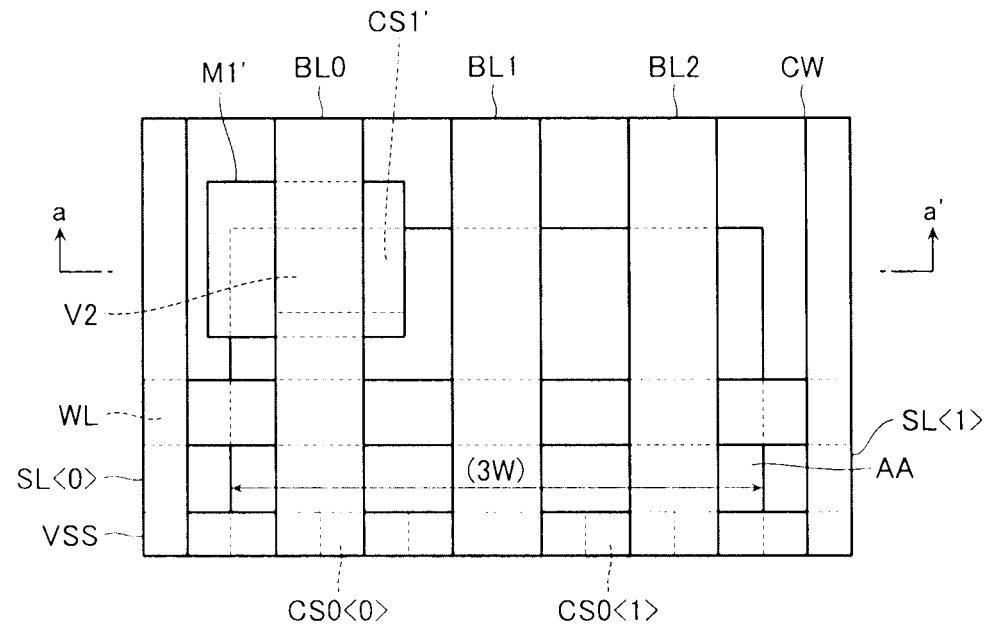
FIG. 25A is a diagram illustrating a layout of the memory cell of the semiconductor memory device according to the embodiment.
Figure 25B:
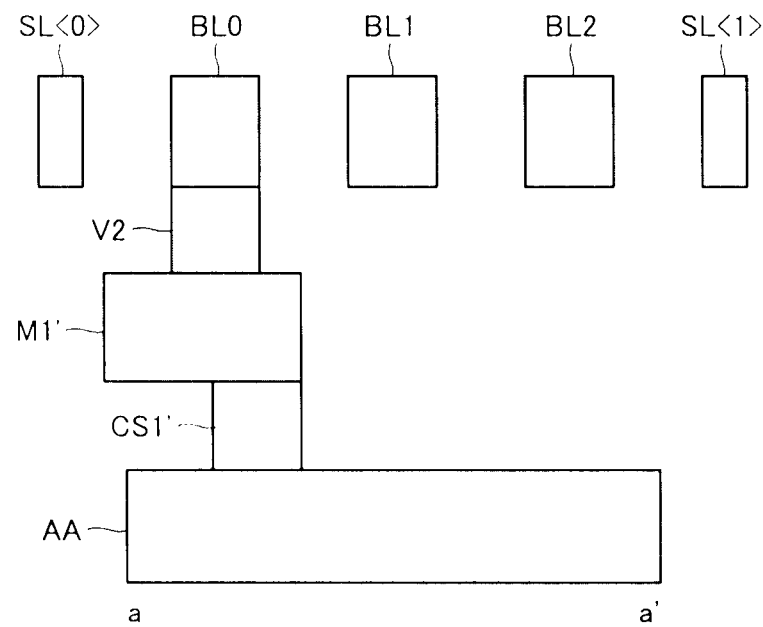
FIG. 25B is a diagram illustrating a cross-section of the layout of the memory cell of the semiconductor memory device according to the embodiment.
Figure 26A:
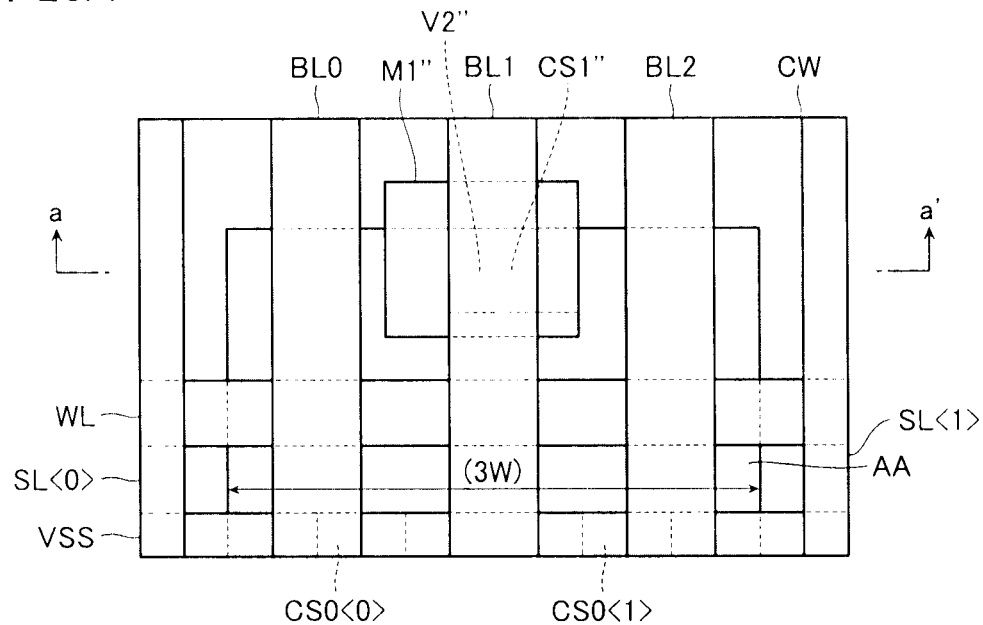
FIG. 26A is a diagram illustrating a layout of the memory cell of the semiconductor memory device according to the embodiment.
Figure 26B:
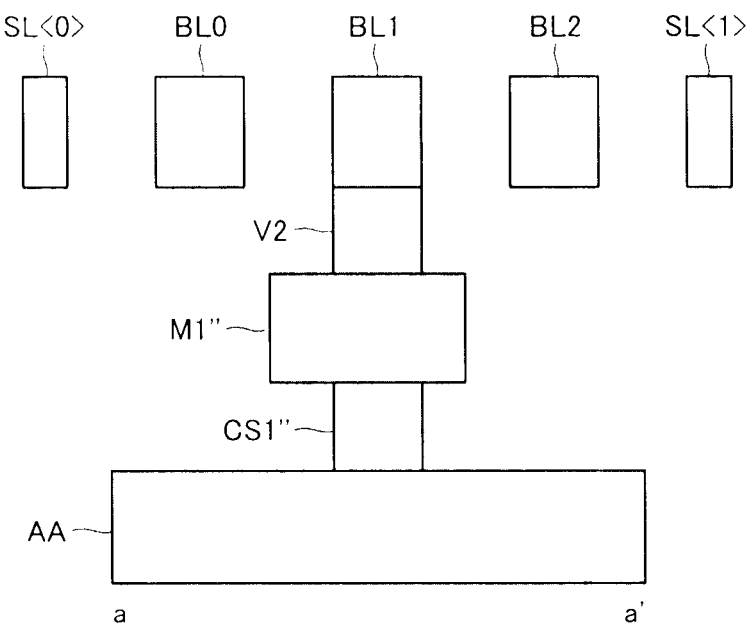
FIG. 26B is a diagram illustrating a cross-section of the layout of the memory cell of the semiconductor memory device according to the embodiment.

In addition, this embodiment as the fourth embodiment can be also applied to a case where the metal wiring is formed only on the lower side of the bit line BL that is connected to the cell transistor CT. FIGS. 25A and 25B are diagrams illustrating the layout of the memory cell MC in a case where shield lines SL<0> and SL<1> are added to the embodiment illustrated in FIGS. 15A and 15B. Similarly, FIGS. 26A and 26B are diagrams illustrating the layout of the memory cell MC in a case where shield lines SL<0> and SL<1> are added to the examples illustrated in FIGS. 16A and 16B. In the case of the embodiments illustrated in FIGS. 25A, 25B, 26A, and 26B, the advantages of the fourth embodiment can be acquired in addition to the advantages of this embodiment.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array that includes a word line extending in a row direction, a bit line group containing a plurality of bit lines extending in a column direction, and memory cells each formed from a transistor formed over an active area of a well and disposed at intersections of the word line and the bit line group;
   a read circuit configured to read out data from the memory cells through the bit lines; and
   a bit line precharge/discharge circuit disposed between the memory cell array and the read circuit, and configured to charge or discharge the bit lines;
   the memory cell having different connection states including a state in which a first terminal of the transistor is not electrically connected to any one of the plurality of bit lines belonging to the bit line group and states in which the first terminal is electrically connected only to a specific one of the plurality of bit lines, the first terminal being a source or a drain of the transistor, and
   an active area serving as a gate of the transistor being continuously formed in arrangement areas of the plurality of bit lines of the bit line group and spaces between the bit lines, when viewed in a stacking direction that is perpendicular to the row direction and the column direction.

2. The semiconductor memory device according to claim 1, wherein the bit line group contains three bit lines, and
   the memory cell stores data of two bits based on four mutually different connection states including a state in which the first terminal of the transistor is not electrically connected to any one of three bit lines belonging to the bit line group and states in which the first terminal is electrically connected only to specific one of the three bit lines.

3. The semiconductor memory device according to claim 1, wherein the bit line group contains two bit lines,
   the memory cell has three different connection states including a state in which the first terminal of the transistor is not electrically connected to any one of the two bit lines belonging to the bit line group and states in which the first terminal is electrically connected only to specific one of the two bit lines, and the memory cell array stores data of at least three bits by using two memory cells.

4. The semiconductor memory device according to claim 1, wherein the bit line group contains two bit lines, the memory cell has two different connection states in which the first terminal of the transistor is electrically connected only to specific one of the two bit lines, and the read circuit includes a differential sense amplifier that generates data of one bit by detecting an electric potential difference of the two bit lines of the bit line group.

5. The semiconductor memory device according to claim 1, further comprising:

a column multiplexer that is disposed between the memory cell array and the read circuit, selects a certain bit line group from among a plurality of the bit line groups, and outputs a signal of the bit line of the selected bit line group to the read circuit.

6. The semiconductor memory device according to claim 5, the memory cell array includes a shield line extending in the column direction and formed between adjacent bit line groups, the shield line being electrically connected to a ground line or a power source line.

7. The semiconductor memory device according to claim 1, wherein:

the memory cell array has a structure in which a plurality of layers are stacked, the bit lines belonging to the bit line groups are formed on the same first one of the layers, and each of the memory cells includes a second one of the layers for forming the metal line disposed between the bit lines and the first terminal of the transistor, and a third one of the layers for forming a via connecting the bit lines and the metal line, layouts of the second and third layers varying depending on the connection states of the first terminal of the transistor and the bit line group.

8. A semiconductor memory, comprising:

a memory cell array that includes a word line extending in a row direction, a bit line group containing a plurality of bit lines extending in a column direction, and memory cells each formed from a transistor formed over an active area of a well and disposed at intersections of the word line and the bit line group; and a read circuit configured to read out data from the memory cells through the bit lines, the memory cell having different connection states including a state in which a first terminal of the transistor is not electrically connected to any one of the plurality of bit lines belonging to the bit line group and states in which the first terminal is electrically connected only to a specific one of the plurality of bit lines, the first terminal being a source or a drain of the transistor, and the read circuit including an encode circuit provided with NOR gates between each of inputs and outputs, and configured to read data from the memory cells by passing a potential of the bits through the encode circuit.

9. The semiconductor memory device according to claim 8, wherein the bit line group contains three bit lines, and the memory cell stores data of two bits based on four different connection states including a state in which the first terminal of the transistor is not electrically connected to any one of the three bit lines belonging to the bit line group and states in which the first terminal is electrically connected only to a specific one of the three bit lines.

10. A semiconductor memory device, comprising:

a memory cell array that includes a word line extending in a row direction, bit line groups containing a plurality of bit lines extending in a column direction, and memory cells each formed from a transistor formed over an active area of a well and disposed at intersections of the word line and the bit line group; and a read circuit configured to read out data from the memory cells through the bit lines, the memory cell having different connection states including a state in which a first terminal of the transistor is not electrically connected to any one of the plurality of bit lines belonging to the bit line group and states in which the first terminal is electrically connected only to a specific one of the plurality of bit lines, the first terminal being a source or a drain of the transistor, and the memory cell array including a shield line extending in the column direction and formed between adjacent bit line groups, the shield line being electrically connected to a ground line or a power source line.

11. The semiconductor memory device according to claim 10, wherein the bit line group contains three bit lines, and the memory cell stores data of two bits based on four different connection states including a state in which the first terminal of the transistor is not electrically connected to any one of the three bit lines belonging to the bit line group and states in which the first terminal is electrically connected only to a specific one of the three bit lines.

12. The semiconductor memory device according to claim 10, wherein the bit line group contains two bit lines, the memory cell has three different connection states including a state in which the first terminal of the transistor is not electrically connected to any one of the two bit lines belonging to the bit line group and states in which the first terminal is electrically connected only to a specific one of the two bit lines, and the memory cell array stores data of at least three bits by using two memory cells.

13. The semiconductor memory device according to claim 10, wherein the bit line group contains two bit lines, the memory cell has two different connection states in which the first terminal of the transistor are electrically connected only to a specific one of the two bit lines, and the read circuit includes a differential sense amplifier that generates data of one bit by detecting an electric potential difference of the two bit lines of the bit line group.

14. The semiconductor memory device according to claim 10, further comprising:

a bit line precharge circuit disposed between the memory cell array and the read circuit, and configured to charge the bit lines.

15. The semiconductor memory device according to claim 10, further comprising:

a column multiplexer that is disposed between the memory cell array and the read circuit, selects a certain bit line group from among a plurality of the bit line groups, and outputs a signal of a bit line of the certain bit line group to the read circuit.

16. The semiconductor memory device according to claim 15, wherein the read circuit includes a precharge circuit configured to charge the bit lines of the certain bit line group selected by the column multiplexer.

17. The semiconductor memory device according to claim 15, further comprising:
a bit line precharge/discharge circuit that is disposed between the memory cell array and the read circuit and charges or discharges the plurality of bit lines.

18. The semiconductor memory device according to claim 14, further comprising:
a column multiplexer that is disposed between the memory cell array and the read circuit, selects a certain bit line group from among a plurality of the bit line groups, and outputs a signal of the bit line of the certain bit line group to the read circuit.

19. The semiconductor memory device according to claim 18, wherein the read circuit includes a precharge/discharge circuit that charges or discharges the bit lines of the bit line group selected by the column multiplexer.

20. The semiconductor memory device according to claim 10, wherein
the memory cell array has a structure in which a plurality of layers are stacked,
the bit lines belonging to the bit line group are formed on the same first one of the layers, and
each of the memory cells includes a second one of the layers for forming a metal line disposed between the bit lines and the first terminal of the transistor, and a third one of the layers for forming a via connecting the bit lines and the metal line, layouts of the second and third layers varying depending on the connection states of the first terminal of the transistor and the bit line group.

* * * * *